United States Patent
Tan et al.

(10) Patent No.: US 8,101,487 B2
(45) Date of Patent: Jan. 24, 2012

(54) METHOD FOR FABRICATING SEMICONDUCTOR DEVICES WITH SHALLOW DIFFUSION REGIONS

(75) Inventors: Dexter Xueming Tan, Singapore (SG); Benjamin Colombeau, Salem, MA (US); Clark Kuang Kian Ong, Singapore (SG); Sai Hooi Yeong, Singapore (SG); Chee Mang Ng, Singapore (SG); Kin Leong Pey, Singapore (SG)

(73) Assignees: Nanyang Technological University, Singapore (SG); National University of Singapore, Singapore (SG); GLOBALFOUNDRIES Singapore Pte. Ltd., Singapore (SG)

( * ) Notice: Subject to any disclaimer, the term of this patent is extended or adjusted under 35 U.S.C. 154(b) by 85 days.

(21) Appl. No.: 12/466,391

(22) Filed: May 15, 2009

(65) Prior Publication Data
US 2009/0286373 A1 Nov. 19, 2009

Related U.S. Application Data

(60) Provisional application No. 61/053,674, filed on May 16, 2008.

(51) Int. Cl.
*H01L 21/336* (2006.01)
*H01L 21/3205* (2006.01)
*H01L 21/4763* (2006.01)

(52) U.S. Cl. ......... 438/301; 438/305; 438/308; 438/591

(58) Field of Classification Search .................. 438/301, 438/510, 305, 473, 474, 476, 303, 275, 306–308, 438/150, 195, 302, 584, 585, 587, 591, 166
See application file for complete search history.

(56) References Cited

U.S. PATENT DOCUMENTS

| | | | |
|---|---|---|---|
| 7,071,069 B2 | 7/2006 | Tan et al. | |
| 7,169,675 B2 | 1/2007 | Tan et al. | |
| 2006/0006427 A1 | 1/2006 | Tan et al. | |
| 2007/0284615 A1 | 12/2007 | Ku et al. | |
| 2008/0090392 A1 | 4/2008 | Singh et al. | |
| 2008/0116487 A1* | 5/2008 | Lee et al. | 257/194 |
| 2008/0157383 A1 | 7/2008 | Lim et al. | |
| 2009/0057678 A1 | 3/2009 | Goldbach et al. | |
| 2009/0087971 A1* | 4/2009 | Colombeau et al. | 438/542 |

OTHER PUBLICATIONS

Cowern, N.E.B et al., Understanding, Modeling and Optimizing Vacancy Engineering for Stable Highly Boron-Doped Ultrashallow Junctions, Electron Devices Meeting, 2005. IEDM Technical Digest. IEEE International Volume , Issue , Dec. 5-7, 2005 pp. 4 pp.
A.E. Michel et al., Rapid Annealing and the Anomalous Diffusion of Ion Implanted Boron into Silicon, Appl. Phys, Lett 50(7) Feb. 16, 1987, p. 416-418, vol. 50, No. 7, American Institute of Physics.

* cited by examiner

*Primary Examiner* — Chuong A. Luu
(74) *Attorney, Agent, or Firm* — Horizon IP Pte Ltd

(57) ABSTRACT

A method for fabricating a semiconductor device is presented. The method includes providing a substrate and forming a gate stack over the substrate. A first laser processing to form vacancy rich regions within the substrate on opposing sides of the gate stack is performed. The vacancy rich regions have a first depth from a surface of the substrate. A first implant causing end of range defect regions to be formed on opposing sides of the gate stack at a second depth from the surface of the substrate is also carried out, wherein the first depth is proximate to the second depth.

18 Claims, 22 Drawing Sheets x Excess Interstitials
△ Excess Vacancies

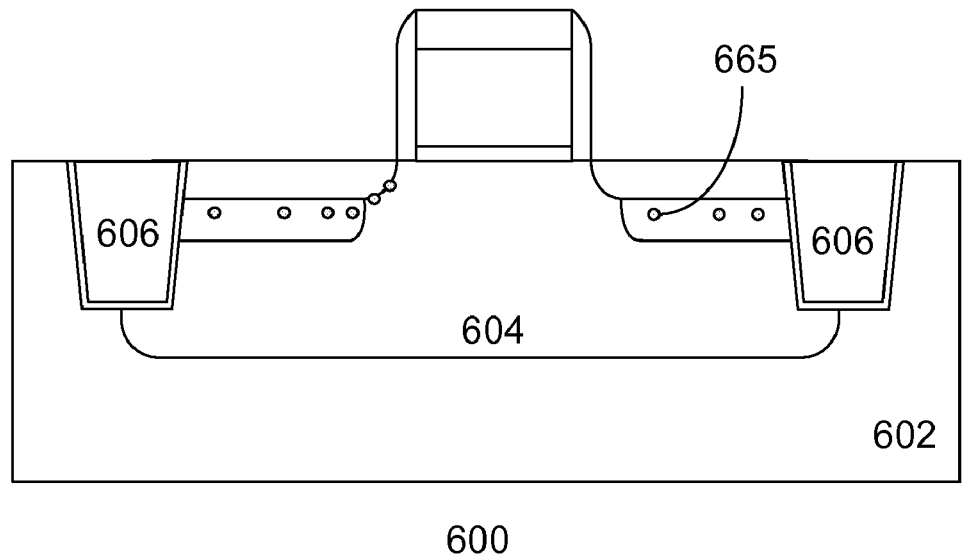
Fig. 6h(i)
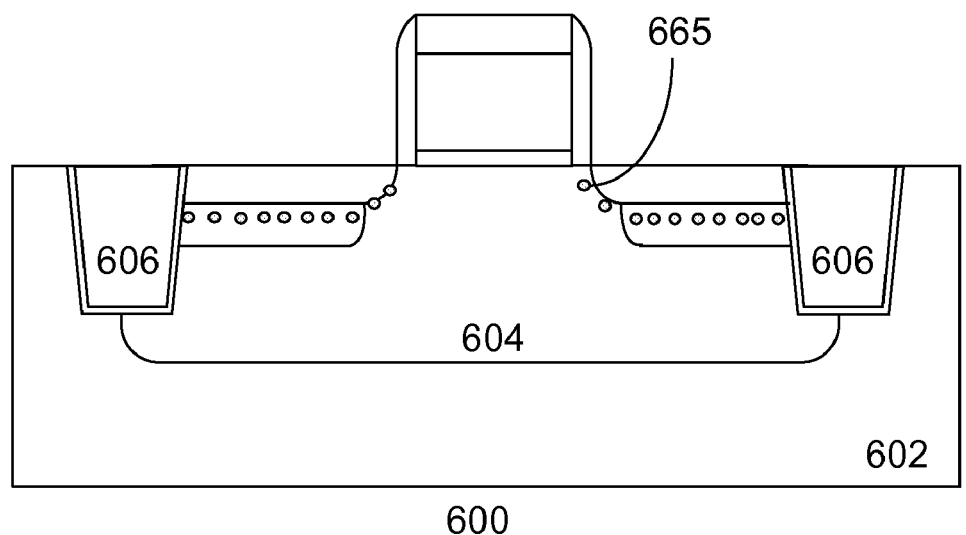
Fig. 6h(ii)

METHOD FOR FABRICATING SEMICONDUCTOR DEVICES WITH SHALLOW DIFFUSION REGIONS

CROSS-REFERENCE TO RELATED APPLICATIONS

This application claims the benefit of U.S. provisional application No. 61/053,674, filed May 16, 2008, entitled "Method for Fabricating Semiconductor Devices with Shallow Diffusion Regions", the entire content of which is herein incorporated by reference.

TECHNICAL FIELD

The present invention relates to generally to methods for fabricating semiconductor devices, and more particularly to methods for fabricating transistor diffusion regions.

BACKGROUND ART

Integrated circuits (ICs) comprising many tens of thousands of semiconductor devices including field effect transistors (FETs) are a cornerstone of modern microelectronic systems. The various regions of the FETs (e.g. source/drain and source/drain extensions) are formed by introducing dopant atoms into a semiconductor substrate using methods such as ion implantation. After the dopants have been introduced, they are electrically activated by subjecting the semiconductor substrate to one or more annealing processes such as low temperature thermal anneal, rapid thermal anneal, spike anneal, flash anneal or laser anneal.

Unfortunately, dopants have a tendency to diffuse or expand both laterally and vertically away from the profile as-introduced during annealing thereby increasing the dimensions of the various device regions. This outward diffusion of dopants is undesirable particularly as semiconductor devices are scaled down in size.

For example, as the gate length of FETs is scaled down to 45 nm and beyond, the source and drain regions of the FET increasingly interact with the channel region, gaining influence on the channel potential. As a result, the gate electrode has reduced control over the on and off states of the channel. This effect is known as the short channel effect. In order to reduce the short channel effect, it is desirable to fabricate FET devices with shallower source/drain extension and/or source/drain junctions and also reduce the lateral extension of these regions after anneal.

Known approaches for the formation of ultra shallow junctions include the use of techniques such as pre-amorphization implant (PAI) to reduce the effect of ion channeling of dopant species. However, the PAI process commonly results in the formation of end of range (EOR) defects regions which include interstitial defects. Interstitials are undesirable as they have the effect of increasing junction depth and deactivating dopants during subsequent annealing steps. In addition, current leakage caused by residual EOR defects not removed by annealing processes is also becoming an important concern as device dimensions are scaled down to less than 100 nm.

In addition to the above-mentioned need for shallow junctions, the level of dopant activation is also a critical factor as device dimensions are scaled down. This is because the resistances of the various diffusion regions (e.g. source/drain regions) increase with the shrinking of diffusion region dimensions. Since an increase in the level of dopant activation has the effect of decreasing resistance, a higher level of dopant activation is desirable.

In view of the above discussion, there is a need for fabrication techniques that can mitigate at least one of the above mentioned problems.

SUMMARY OF THE INVENTION

The present invention relates to semiconductor devices and in particular, to the formation of diffusion regions in semiconductor devices.

In accordance with a first aspect of the invention, there is provided a method for fabricating a semiconductor device comprising providing a substrate, forming a gate stack over the substrate and performing a first laser processing to form vacancy rich regions within the substrate on opposing sides of the gate stack. The vacancy rich regions have a first depth from a surface of the substrate. A first implant is carried out after the first laser processing, the first implant causing end of range defect regions to be formed on opposing sides of the gate stack at a second depth from the surface of the substrate. The first depth is proximate to the second depth.

These and other objects, along with advantages and features of the present invention herein disclosed, will become apparent through reference to the following description and the accompanying drawings. Furthermore, it is understood that the features of the various embodiments described herein are not mutually exclusive and can exist in various combinations and permutations.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which:

FIG. 1b is schematic graph depicting the as-implanted Boron concentration profile for a substrate processed using the method in FIG. 1a;

FIG. 2b is schematic graph depicting the as-implanted Boron concentration profile for a substrate processed using the method in FIG. 2a;

FIGS. 6a to 6h(i) are schematic cross-sectional views illustrating the results of progressive stages in fabricating a semiconductor structure in accordance with a first embodiment of the invention;

FIG. 6h(ii) is a schematic cross-sectional view illustrating a semiconductor structure with a process flow similar to that described in relation to FIGS. 6a to 6h(i) but excluding a pre-implant laser step;

DETAILED DESCRIPTION

The making and using of embodiments of the invention are discussed in sufficient detail below to enable those skilled in the art to make and use the invention. It is to be appreciated that other embodiments would be evident based on the present disclosure, and that system, process, or mechanical changes may be made without departing from the scope of the present invention.

Generally, the following embodiments relate to the formation of diffusion regions in semiconductor devices including a first laser process where vacancy rich regions are formed at a first depth from the surface of a substrate. A first implant is carried out after the pre-implant laser process wherein the first implant causes the formation of end of range (EOR) defect regions at a second depth from the surface of the substrate. By engineering the depth of the vacancy rich regions such that they are approximately equal to the depth of the EOR regions, the number of interstitials in the EOR defect regions can be reduced. Accordingly, interstitial related problems such as transient enhanced diffusion and dopant deactivation may be mitigated. By way of example, the first implant may be a pre-amorphization implant or other amorphization implants such as a deep source/drain implant.

Figure 1A:
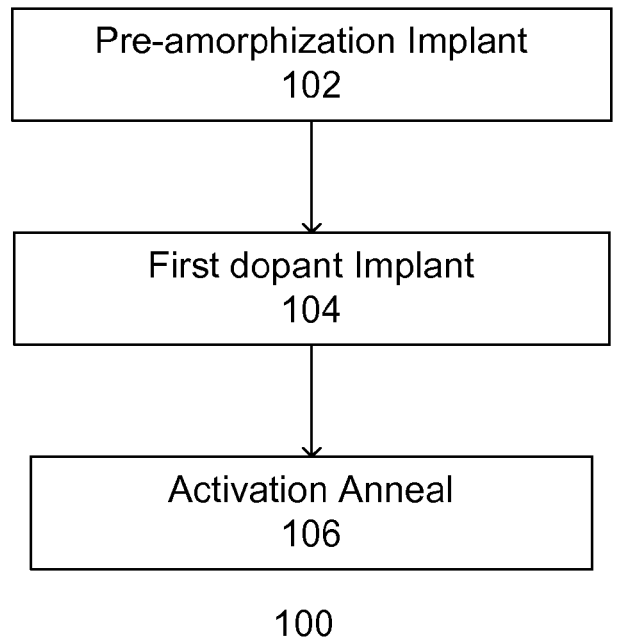
FIG. 1a is a flow chart of a know method for forming a diffusion region comprising first dopants.

FIG. 1a shows a known process flow 100 for fabricating a diffusion region. In this process flow, a silicon substrate is subjected to a pre-amorphization implant (PAI) in step 102 to form an amorphous region in the substrate followed by the implantation of a first dopant to form a first diffusion region in step 104. The first diffusion region and the amorphous region overlap and the pre-amorphization implant is used to reduce the extent of first dopant channeling when first dopants are implanted into the substrate. Reducing the extent of channeling facilitates the formation of diffusion regions with shallow junction depth. PAI schemes that may be used include using inert ions such as Ge or Si for pre-amorphizing, or using a dopant as self-amorphizing.

In step 106 of FIG. 1a, the silicon substrate is subjected to an annealing process to activate the first dopants in the first diffusion region. Annealing processes such as rapid thermal annealing (RTA), spike annealing, laser annealing or flash annealing may be used. Solid-phase epitaxial re-growth (SPER) of the amorphous region occurs during the annealing process.

Figure 1B:
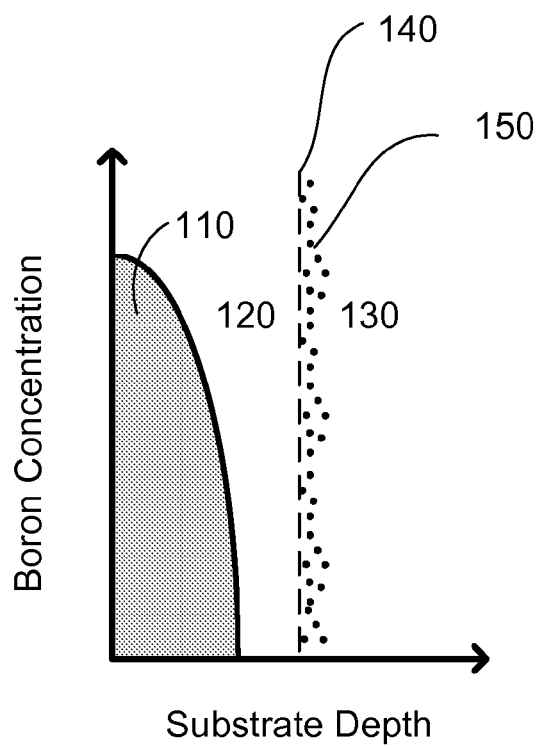

FIG. 1b shows the dopant concentration versus substrate depth profile for an example where a silicon substrate is processed using the above described process flow 100. In this example, Boron is used as a first dopant. The dopant concentration profile for Boron after activation anneal (that is after step 106) is represented by the curve 110. 120 denotes the location of an amorphous region in the silicon substrate, 130 a crystalline region in the silicon substrate and the dotted line 140 represents the amorphous/crystalline interface. While the pre-amorphization implantation step 102 can help to facilitate ultra-shallow junction formation by reducing Boron channeling, it also leaves behind an end-of-range (EOR) defect region 150 located just beyond the amorphous/crystalline interface 140. The EOR region is rich in Si-interstitials. During post-implantation activation anneal (step 106), the Si-interstitials agglomerate into extended defects and evolve via the Ostwald ripening mechanism thus resulting in problems such as first dopant transient enhanced diffusion, first dopant deactivation as well as junction leakage.

For the case when Boron is used as a first dopant, Boron-rich clusters form in the region of high Boron concentration, and beyond the initial amorphous/crystalline interface 140. When the amorphous region 120 re-crystallizes during solid-phase epitaxial re-growth in step 106, interstitials from the EOR region agglomerate into interstitial-clusters. These interstitial-clusters result in transient enhanced diffusion (TED) and dopant deactivation of Boron. In diffusion regions acquired through PAI, the EOR defect band is located beyond the high-concentration Boron region, so that deactivation requires transport of interstitials from the EOR band towards the surface, forming inactive Boron Interstitial Clusters (BICs). The stability of the boron-doped junction formed by the technique of FIG. 1a is of a concern since dopant deactivation may arise upon subsequent thermal treatments not limited to post implant activation anneal 106.

Figure 2A:
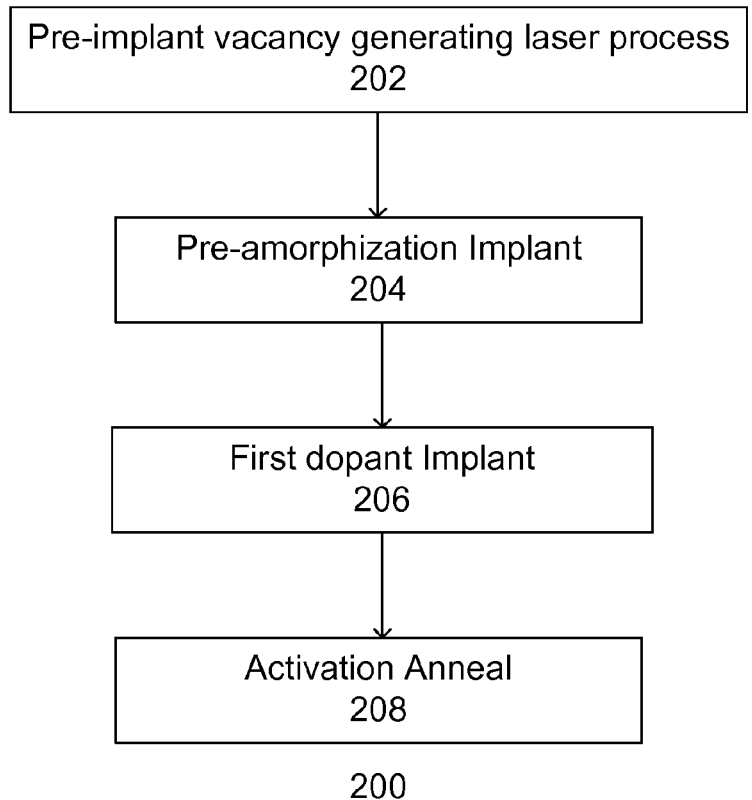
FIG. 2a is a flow chart of a method for forming a diffusion region comprising first dopants in accordance with an embodiment of the present invention.

In an exemplary embodiment of the present invention, the problems generated by interstitials in the EOR region 150 of FIG. 1b may be mitigated by adding a pre-implant laser step before the pre-amorphization implantation step 102. A flow chart 200 representing the exemplary embodiment is shown in FIG. 2a. A silicon substrate is subjected to a pre-implant vacancy generating laser process in step 202 followed by a pre-amorphization implant in step 204. A first dopant is then implanted to form a first diffusion region in step 206 followed by a post-implant anneal in step 208 to activate the first dopants in the first diffusion region. Annealing processes such as but not limited to rapid thermal annealing, spike annealing, laser annealing or flash annealing may be used. Solid-phase epitaxial re-growth of at least a substantial portion of the amorphous region occurs during the annealing process.

The pre-implant vacancy generating laser process in step 202 is optimized to form a vacancy rich region proximate to an EOR region generated by the pre-amorphization implantation step 204. In one embodiment, the depth of the vacancy rich region corresponds to the maximum melt-depth of a laser fluence used in the pre-implant laser step. The depth of a vacancy rich region is used herein to denote a depth at which a peak concentration of vacancies exist while the depth of an EOR region is used to denote a depth at which a peak concentration of defects exist. The vacancies in the vacancy rich region combine with the interstitials in the EOR defect region thereby reducing the number of interstitials released from the EOR region. Consequently, problems caused by EOR interstitial defects can be reduced thus bringing about one or more effects such as a suppression in transient enhanced diffusion of first dopant species, improved activation of dopants, decrease in leakage current due to EOR defects, significant removal of end-of-range defects, reduced lateral diffusion leading to a better control of short channel effect.

Figure 2B:
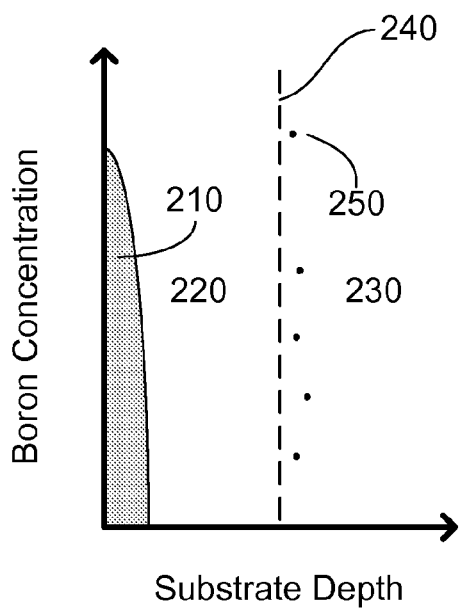

FIG. 2b shows the dopant concentration versus substrate depth profile for an example where a silicon substrate is processed using process flow 200 and Boron is implanted as a first dopant. The dopant concentration profile for Boron after activation anneal (that is after step 208) is represented by the curve 210. 220 denotes the location of an amorphous region in the silicon substrate, 230 a crystalline region in the silicon substrate and the dotted line 240 represents the amorphous/crystalline interface. As a result of the pre-implant laser process in step 202, there are fewer residual defects such as interstitials in the EOR region compared to FIG. 1b where there is no pre-implant laser process. Consequently, the extent of Boron diffusion during activation anneal is reduced for FIG. 2b and the Boron diffusion region in FIG. 2b is shallower than the Boron diffusion region in FIG. 2a.

In an experiment carried out by the inventors, a number of Czochralski-grown n-type (100) silicon wafers were subjected to a pre-implant laser irradiation process where the wafers were pre-irradiated by a KrF excimer laser of wavelength 248 nm at 0.72 J/cm$^2$ in a nitrogen ambient with a laser pulse duration of 23 ns and a repetition rate of 1 Hz. The high fluence excimer laser irradiation melts the surface of the substrate and the melted surface layer undergoes a liquid phase epitaxy regrowth. Re-crystallization of the melted layer creates a point defect deformation beyond the liquid/solid interface. The laser induced point-defects are confirmed by double-crystal X-ray diffraction measurements to be vacancy type.

The wafers were then split into groups a, b and c after laser irradiation, where the wafers in each group were pre-amorphized using Si$^+$ implantations with an identical dose of 1×10$^{15}$ cm$^{-2}$ but at an energy of 20 keV, 40 keV and 100 keV for groups a, b and c respectively. After the pre-amorphization implant, B$^+$ implantation was carried out to introduce Boron dopants into the substrate of all wafers. The B$^+$ implantation was performed at an energy of 5 keV with a dose of 1×10$^{15}$ cm$^{-2}$ at a tilt 7° and a twist 22°. Finally, the wafers are subjected to a rapid thermal processing (RTP) at 800° C. to activate the Boron dopants.

Table I provides experimental data for the three different groups a, b, and c in terms of the pre-amorphization implant energy, depth of amorphous region formed by the pre-amorphization implant and maximum melt depth of the pre-implant laser irradiation process. Since the wafers in all three groups were subjected to the same pre-implant laser process conditions, the maximum melt depth of the wafers are identical at 60 nm. In this experiment, the maximum melt depth of the pre-implant laser process corresponds to the depth of a vacancy rich region generated by the process.

TABLE I

| Group | a | b | c |
|---|---|---|---|
| Pre-amorphization implant energy (keV) | 20 | 40 | 100 |
| Amorphous region depth (nm) | 40 | 60 | 120 |
| Maximum melt depth (nm) | 60 | 60 | 60 |

In order to compare the effects of different processing conditions for groups a, b and c, the dopant concentration profile and sheet resistances of wafers in the respective groups were measured.

Figure 3A:
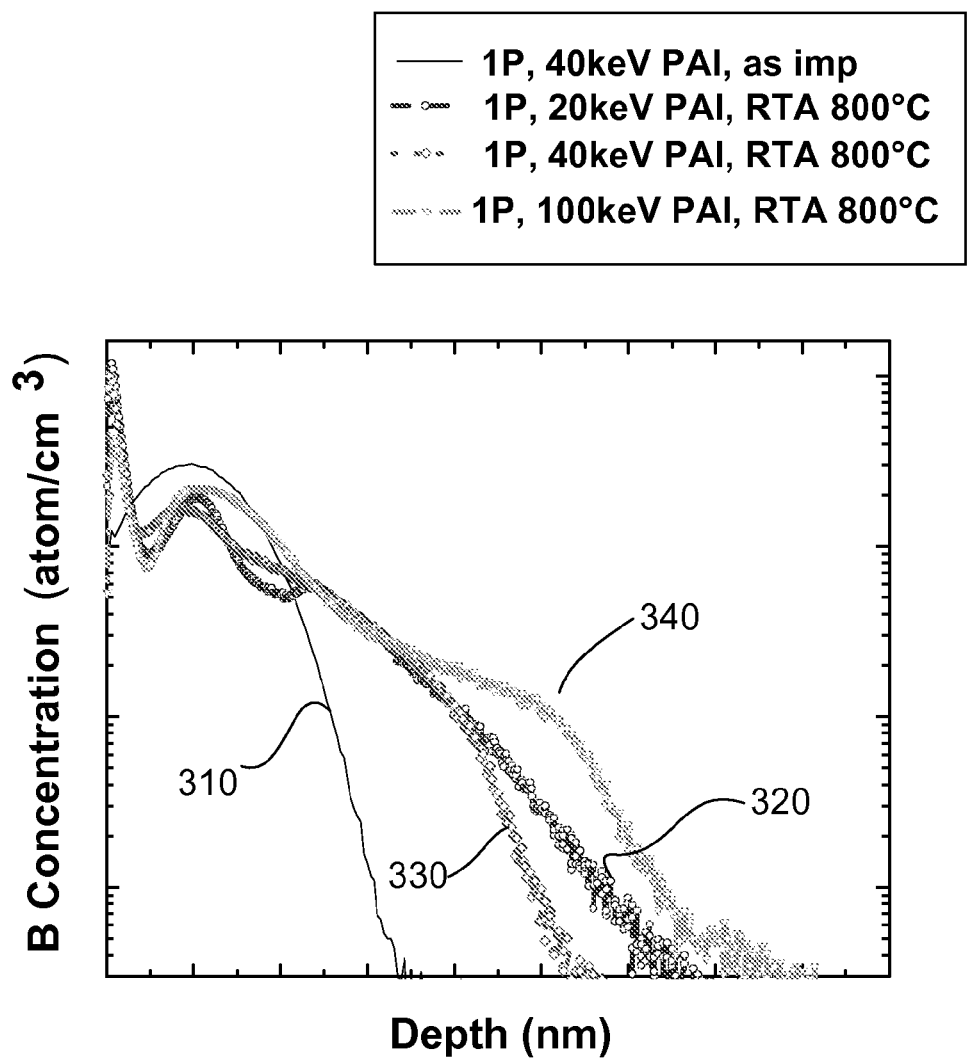
FIG. 3a is a graph showing the after anneal Boron concentration profile for samples a, b, and c processed in a method in accordance with an embodiment of the present invention.

FIG. 3a shows the variation in Boron concentration as a function of depth from the surface of a substrate. Graph 310 is the dopant profile for a 40 keV pre-amorphization sample as-is after Boron implant. Graphs 320, 330 and 340 correspond to the profile of 20 keV, 40 keV and 100 keV PAI samples after anneal. As shown in FIG. 3, the 40 keV PAI sample 330 exhibits the least Boron diffusion followed by the 20 keV PAI sample 320. The 100 keV PAI sample 340 experienced the most Boron diffusion and hence had the deepest junction depth as evident from its dopant profile 440.

As shown from the annealed profiles in FIG. 3a, the relationship between the depth of the amorphous region (and hence location of the end of range defect region) versus the location of the maximum melt depth is critical. By matching the amorphous region depth substantially with the maximum melt depth as per case for the group b, 40 keV samples, boron dopant diffusion during annealing can be effectively reduced. As discussed earlier, the pre-amorphizing implant creates an End of Range (EOR) region below the amorphous region proximate the amorphous/crystalline interface. The excess vacancies in the vacancy rich region can recombine with interstitials in the EOR thereby helping to suppress interstitial aided diffusion mechanisms such as transient enhanced diffusion. By reducing lateral and vertical diffusion, there is improved control of source/drain dimensions. Matching of the amorphous region depth and maximum melt depth may be achieved through the adjustment of implant conditions such as ion implantation energy. Although the currently described experiments rely on the adjustment of implant conditions to match amorphization depth with the laser melt-depth, it is also possible to adjust the maximum laser melt depth instead for example, by tuning the energy of the laser fluence.

In addition to the above, the sheet resistances $R_S$ for the different groups were also compared. The 20 keV and 40 keV PAI samples had resistances of 300 ohm/□ and 250 ohm/□ respectively. However, the $R_S$ of the 100 keV samples was significantly higher at 550 ohm/□. The variation in $R_S$ is correlated with the change in Boron activation level as the PAI conditions are varied. This is because the excess vacancies in the vacancy rich region help to remove the interstitials thereby increasing Boron dopant activation. Therefore, the closer the end of range region depth and maximum melt depth are matched the greater the improvement in dopant activation. A similar $R_S$ trend (not shown) was also obtained when the samples are subjected to a 1000° C. of RTA annealing instead of 800° C.

Figure 3B:
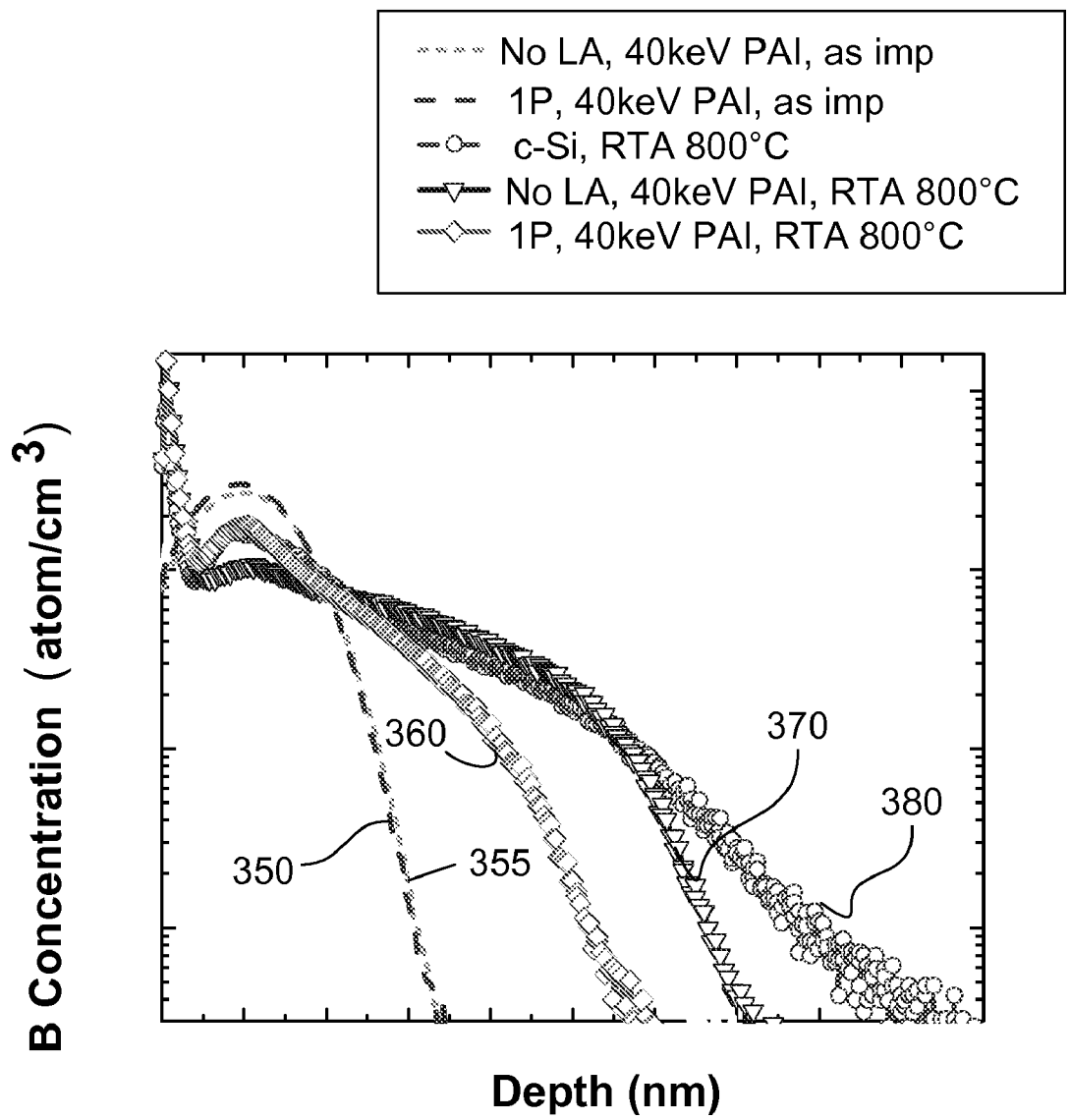
FIG. 3b is a graph showing Boron concentration profile for samples without PAI, with PAI, and with PAI and pre-implant laser processing in accordance with an embodiment of the present invention.

FIG. 3b shows Boron concentration profiles for samples in a crystalline silicon substrate and in silicon substrates that have been pre-amorphized by a 40 keV Si$^+$ implantation. Within the group of samples that have been amorphized, samples that are subjected to a 0.72 J/cm$^2$ single-pulse pre-implant laser process prior to PAI 360 are compared with samples which have not been pre-irradiated 370. The pre-implant laser process is optimized to substantially match the maximum laser melt depth with a depth of an amorphous region generated by the PAI implant. 350 and 355 correspond to the profiles of both PAI samples after Boron implant but prior to an RTA at 800° C. for 60 s, 360 is the profile for the pre-irradiated PAI sample post anneal and 370 is the profile for the non pre-irradiated PAI sample post anneal. Meanwhile, 380 corresponds to the after anneal Boron profile in a crystalline substrate that has not be pre-amorphized prior to boron implantation. As expected, the Boron profile in the crystalline substrate 380 has the deepest junction depth, which can be mainly attributed to channeling effect during Boron implantation. The samples with PAI (360, 370) in comparison have a shallower junction depth. Interestingly, the sample pre-irradiated with laser prior to the 40 keV Si$^+$ PAI step provides the shallowest post anneal Boron distribution profile 360. The reduction in the junction depth is more than 30 nm (about 40%) compared to the identical PAI counterpart without undergoing the pre-implant laser treatment. Therefore, we can conclude from the experimental results that Boron transient enhanced diffusion can be significantly suppressed by a pre-implant laser process.

Figure 4:
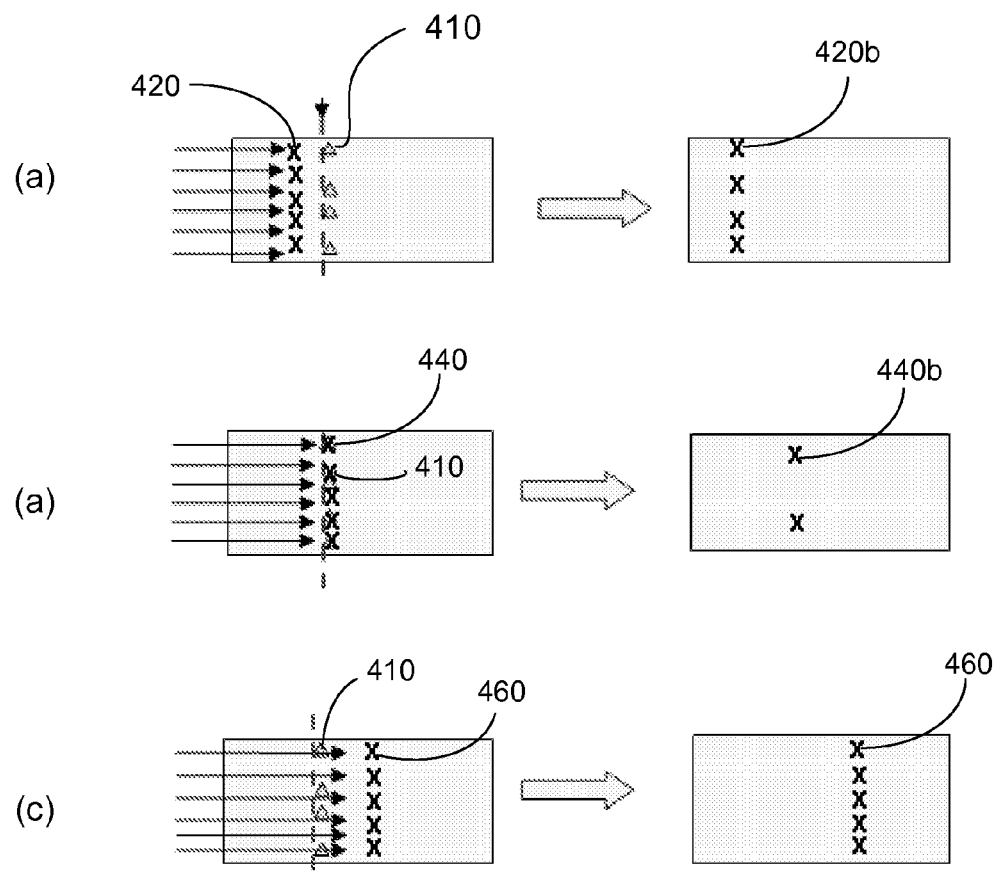
FIGS. 4a to 4c are schematic representations showing the mechanism associated with the interaction of laser induced vacancies with interstitials in a EOR region created by a pre-amorphization implant.

FIGS. 4a-4c illustrate physical mechanisms involving dopant-defect interaction, particularly, the different modes of interstitial and vacancy interaction for various PAI conditions in a laser pre-irradiated silicon. The figures on the left hand side before the arrows represent the samples during a pre-amorphization implant step while the figures on the right hand side are schematic representations of the samples after pre-amorphization implant and activation anneal. As mentioned earlier, the maximum melt depth of for all the three experiments a, b, and c is identical at about 60 nm. Thus, the majority of the vacancies formed by the pre-implant laser irradiation are located at a maximum melt-depth of 60 nm which is denoted by the reference numeral 410 in FIGS. 4*a*-4*c*.

FIG. 4*a* corresponds to the schematic for a group a, 20 keV Si$^+$ PAI energy sample. As discussed earlier, the 20 keV PAI sample will result in an amorphization depth of ~40 nm that is shallower than the maximum laser melt depth (~60 nm). Therefore, the Si interstitials 420 introduced by the Si$^+$ PAI will reside at a displacement nearer to the substrate surface compared to the location of the excess vacancies. During the RTA activation at 800° C., extended defects in the EOR region will then evolve through the Oswald ripening mechanism. Since the vacancies are located at a deeper within the substrate than the EOR defect region location, the recombination of the emitted self interstitials from the EOR region with the laser-generated vacancies is less effective. This is evident from the number of interstitials 420*b* remaining after recombination. Hence, the self-interstitials will tend to flow towards silicon surface and interact with the Boron dopants, leading to the formation of inactive boron-interstitial clusters (BICs) as well as causing TED of Boron when the wafer is annealed. In addition, boron trapping at depth of ~45 nm-50 nm below the Si surface has been also been observed for the 20 keV PAI sample, which is attributed to the presence of the interstitial-rich EOR region.

FIG. 4*b* shows the case in which the amorphization depth which coincides with the maximum melt-depth induced by the laser fluence (~60 nm). With the matching of the two displacements, the initial supersaturation of interstitials caused by the PAI process is greatly reduced due to the recombination of the silicon interstitials 440 with the melting laser-generated excess vacancies 410. Therefore, the number of residual interstitial defects 440*b* is less compared to experiment in FIG. 4*a*, resulting in a shallow junction profile 330 as shown in FIG. 3(*a*). It is expected that the flux of the silicon interstitials during the post implant annealing is greatly decreased as a result of the recombination thus reducing the interaction between interstitials and Boron atoms. Accordingly, boron-interstitials (BI) pairing and BICs formation is reduced, thereby suppressing the corresponding TED of Boron and improving Boron activation (lower $R_S$). The results demonstrate that the appropriate choices of the PAI energy to coincide the PAI depth with the corresponding laser fluence can effectively reduce dopant-defect interaction and improve junction characteristics.

For the case of the 100 keV PAI sample shown in FIG. 4*c*, the amorphization depth (~120 nm) is much deeper than the maximum melt-depth (~60 nm) created by the laser pre-irradiation. Interstitials generated by the pre-amorphization implant step are denoted in FIG. 4*c* by the reference numeral 460. Since the amorphous region is much greater than the melt depth, it is expected that no vacancies previously present at the maximum melt-depth survive. This is because the random arrangement of atoms in an amorphous region doesn't allow for the existence of vacancies. Accordingly, the situation in FIG. 4*c* is analogous to a process where there is no pre-implant laser irradiation prior to PAI implant. In this situation, TED will dominate due to the end of range defects such as intersitials that are present in large numbers and as such a deep Boron dopant profile is expected. Similarly, the supersaturation of the silicon interstitials from the EOR region towards the surface leads to significant BICs formation which causes the junction to have a large $R_S$ compared to the previous two cases shown in FIG. 4*a* and 4*b*.

Figure 5A:
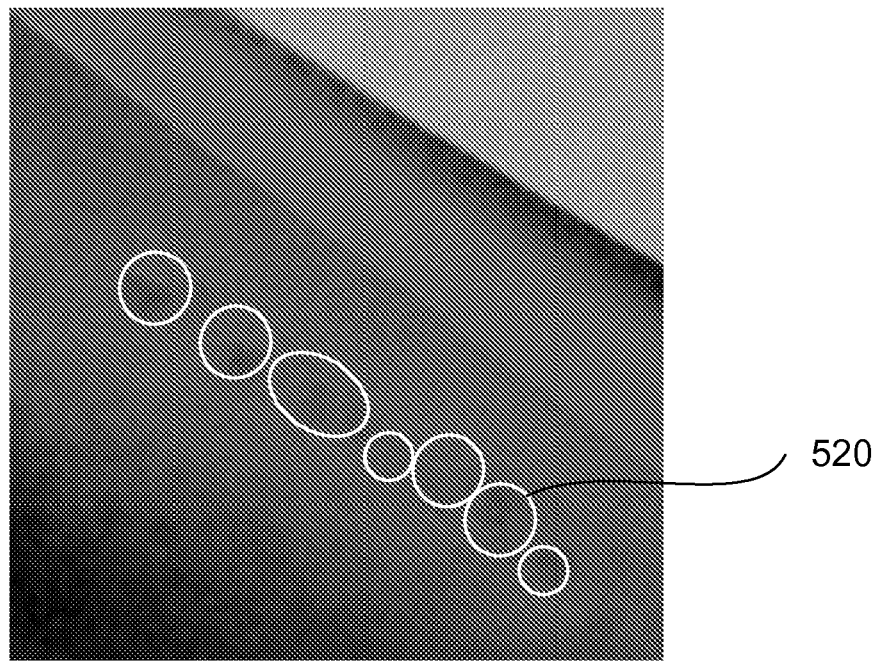
FIGS. 5a to 5b are cross-sectional TEM micrographs for samples with and without pre-implant laser treatment.
Figure 5B:
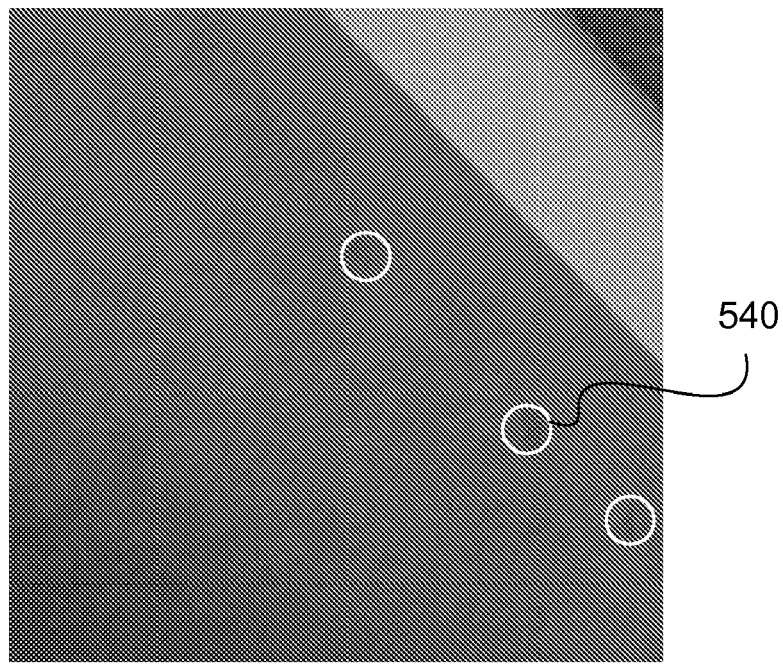

FIGS. 5*a* and 5*b* are post anneal TEM cross-sections of samples have been pre-amorphized with Si$^+$ amorphization energies of 40 keV. FIG. 5*a* corresponds to a sample that has not been subjected to a pre-implant laser process while FIG. 5*b* corresponds to a sample with a single-pulse irradiation of 0.72 J/cm$^2$, wherein the maximum melt depth is substantially matched with the depth of the amorphous region. As evident from the TEM cross-sections, the density of EOR defects 540 in FIG. 5*b* is less than the density of EOR defects 520 in FIG. 5*a* as a result of the maximum melt depth and amorphous region being substantially matched in the former.

It is to be appreciated that the above described experiment is only for purposes of illustration and the invention is not to be limited to the specific process conditions described. The implant conditions, dopant species, pre-implant laser process conditions may be varied without departing from the invention. The objective of the invention is to generate using a first laser process, a vacancy rich region wherein the depth of the vacancy rich region is proximate to the depth of an end of range region generated by a subsequent implant.

The fabrication of the preferred embodiments is discussed in detail below. It should be appreciated, however, that the present invention provides many applicable inventive concepts that are embodied in a wide variety of specific contexts. The specific embodiments discussed are merely illustrative of specific ways to make and use the invention, and do not limit the scope of the invention.

FIGS. 6*a* to 6*h* are cross-sectional views illustrating process steps for fabricating a Metal Oxide Field Effect Transistor (MOSFET) in accordance with a first embodiment of the invention. It should be noted that embodiments of the invention are described in the context of fabricating a MOSFET for illustrative purposes only and the invention is not limited as such but is equally applicable to the formation of other semiconductor devices.

Additionally, it is to be understood that a plurality of conventional processes that are well known in the art and not repeated herein, may precede or follow FIGS. 6*a*-6*h*. Moreover, it is to be understood that many modifications, additions, and/or omissions may be made to the below described process without departing from the scope or spirit of the claimed subject matter. For example, the below described process may include more, fewer, or more steps. Also, it is to be appreciated that the present disclosure need not be limited to the initial integrated circuit structure depicted by FIG. 6*a*.

Figure 6A:
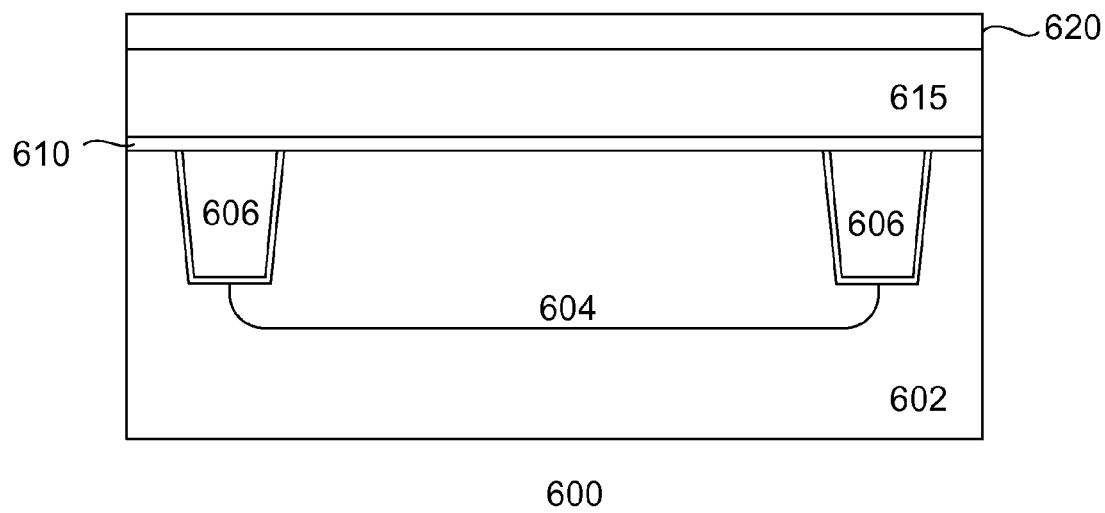

Referring now to FIG. 6*a*, therein is shown a semiconductor structure 600 comprising a semiconductor substrate 602 including a well 604 formed within. In one embodiment, the substrate 602 comprises a P-type bulk silicon substrate having an N-well in which PMOS devices may be formed. Alternatively, other bulk semiconductor materials or a compound semiconductor materials such as but not limited to germanium, silicon carbide, gallium arsenide or indium arsenide may also be used for the substrate 602. The substrate 602 may also be a silicon on insulator substrate.

Trench isolation structures 606 are also formed within the substrate to isolate active areas on the substrate 602. Alternatively, other isolation structures such as field oxide isolation structures may also be used.

A gate dielectric material 610 is deposited over surface of the substrate 602 followed by a layer of gate electrode material 615 and a gate capping layer 620. The gate capping layer 620 is made of materials that are capable of preventing the polysilicon electrode layer 615 from melting when the semiconductor structure 600 is subjected to a laser irradiation process. In one embodiment, the gate electrode layer 615 is made of polysilicon and the gate capping layer 620 is a poly capping layer. Materials such as $SiO_2$, SiON, SiN, SiC, or combinations thereof may be used for poly capping layer 620. Alternatively, other materials that can prevent the polysilicon electrode layer 615 from melting under laser irradiation are also suitable.

Each of the foregoing gate dielectric layer 610 and gate electrode layer 615 are generally conventional in the semiconductor fabrication art. For example, the gate dielectric layer 610 may comprise a dielectric material such as silicon dioxide, silicon oxynitride, silicon nitride, a high-K metal oxide or a combination thereof. Alternatively, other dielectric materials may also be used. The gate dielectric 610 may be deposited using methods such as thermal oxidation, chemical vapour deposition, rapid thermal oxidation or the like as known in the art. As for the gate electrode layer 615, it may comprise a conductive or semi-conductive material. Non-limiting examples include doped polysilicon, a metal silicide or a combination thereof.

Figure 6B:
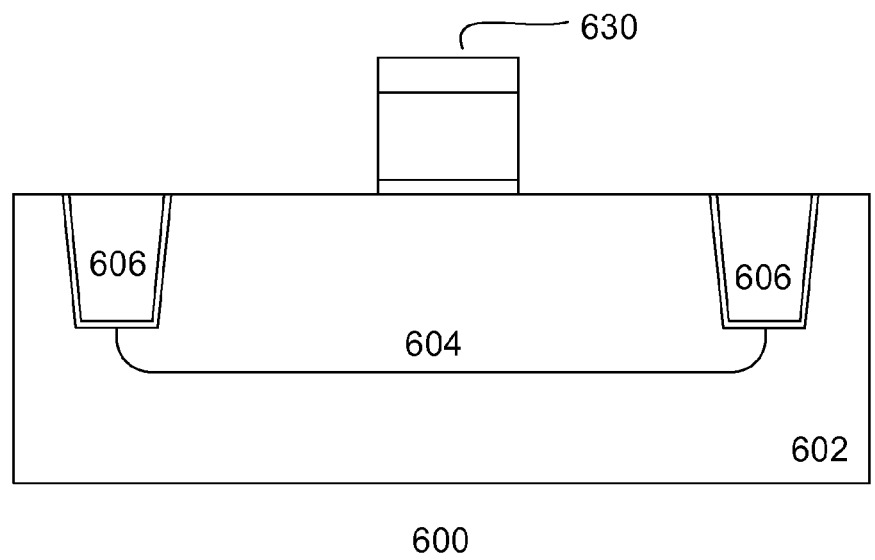

FIG. 6b shows the results of patterning the gate dielectric layer 610, gate electrode layer 615 and gate capping layer 620 in FIG. 6a to form a gate stack 630. Conventional patterning methods such as lithography patterning using photoresist followed by selective sequential etching of the gate capping layer, the gate electrode layer and the gate dielectric layer may be used to define the gate stack 630. After etching is completed, the photoresist mask is stripped off and the final gate stack structure is as shown in FIG. 6b.

Figure 6C:
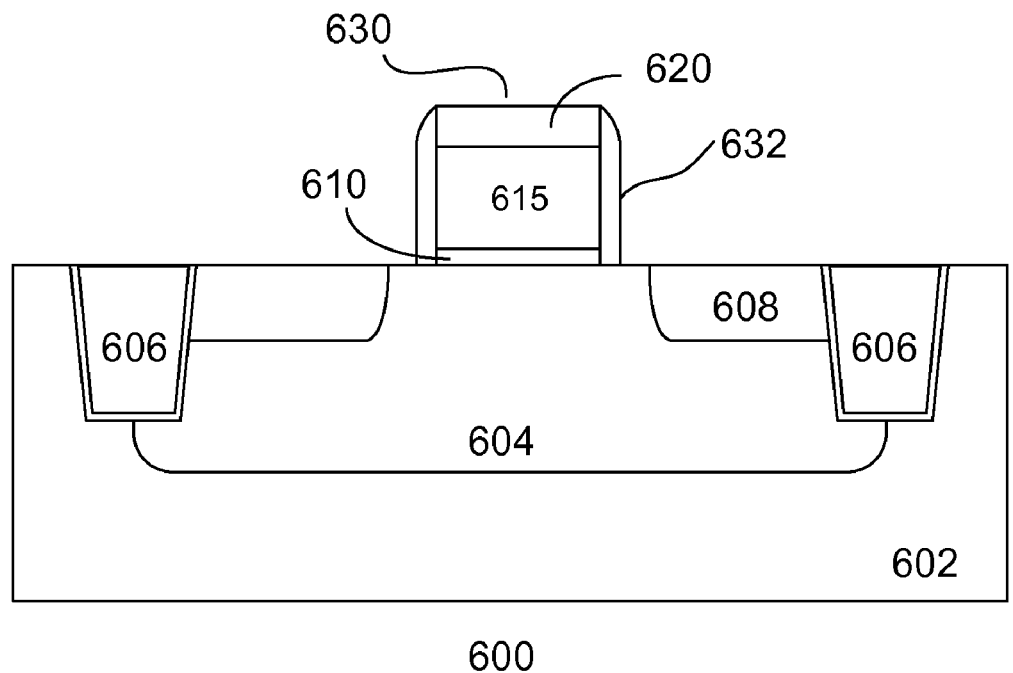

FIG. 6c shows the semiconductor structure 600 of FIG. 6b after dummy spacers (not shown) are formed proximate the sidewalls of the gate stack 630 followed by the formation of deep source/drain regions 608 within the substrate on opposing sides of the gate stack 630. The deep source/drain regions 608 may be formed by implanting suitable first dopant species into the substrate 602 and using the dummy spacers as an implant mask to offset the edge of the deep source/drain regions 608 from the edge of the gate electrode 615. An annealing process such as high temperature rapid thermal annealing (RTA) may optionally be carried out after the implant to activate the first dopants. Alternatively, the deep source/drain regions may also be activated at a later stage, for example, after source/drain extension dopants have been implanted. In the embodiment of FIG. 6c, the dummy spacers are etched back after deep source/drain region formation resulting in first offset spacers 632 of a narrower width. The edge of the deep source/drain regions 608 as implanted is therefore offset from the edge of the first offset spacers 632. The purpose of etching back the dummy spacers is to adjust the extent of junction-to-gate overlap between a subsequently formed source/drain extension region and the edge of the gate electrode 615.

Figure 6D:
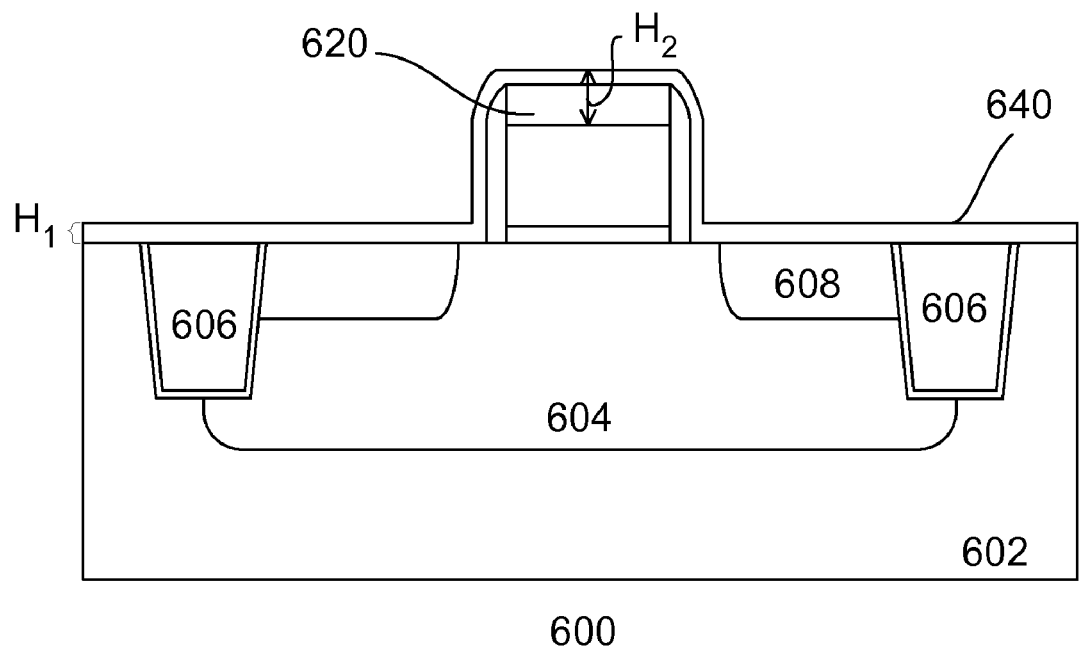

In FIG. 6d, an optical coating layer 640 is applied over the semiconductor structure 600 of FIG. 6c. In one embodiment, the optical coating layer may comprise an oxide-based dielectric layer. The optical coating layer 640, alone or in combination with the gate capping layer 620 form an optical layer that responds differentially to incident laser light depending on its local thickness. For example, the optical layer portion overlying the top of the gate electrode 615 is composed of the gate capping layer 620 and optical coating layer 640 and has a thickness of $H_2$. The combined thickness $H_2$ is chosen so as to provide an optical reflective property such that laser light impinging thereon is mostly reflected. This prevents the gate electrode 615 from melting during pre-implant laser irradiation. On the other hand, sections of the substrate where an amorphous region is to be formed in a subsequent step such as within the deep source/drain region 608, have to be melted by incident laser fluence so as to generate vacancy rich regions. Accordingly, portions of the optical layer overlying such regions will have a thickness that results in laser transmission to the underlying substrate. In FIG. 6d, only the optical coating layer 640 overlies the deep source drain regions 608 and it has a thickness $H_1$ which results in laser transmission.

Figure 6E:
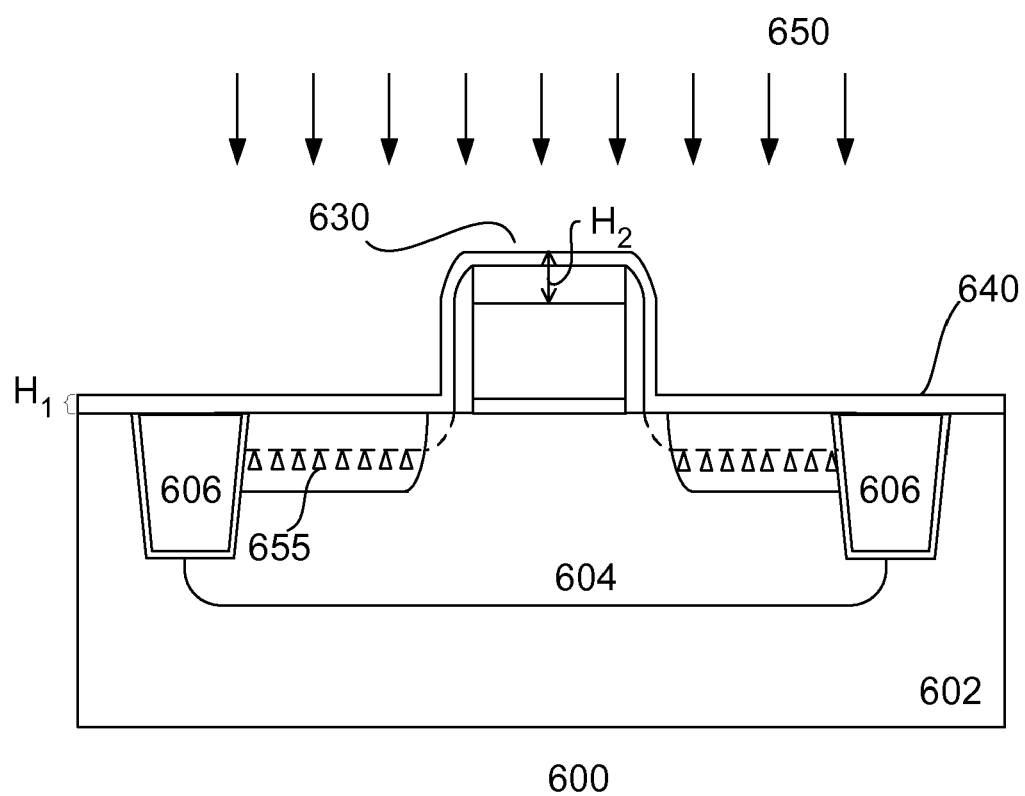

Referring now to FIG. 6e, therein is shown the structure of FIG. 6d in a pre-implant laser step. Arrows 650 depict the irradiation of laser fluence in a laser process that has been optimized to create vacancy rich regions 655 in the substrate on opposed sides of the gate stack 630. During the pre-implant laser step, the optical layer reflects laser fluence from the gate electrode region thus preventing the gate electrode 615 from melting while allowing incident laser fluence to be transmitted/absorbed through to locations corresponding to desired vacancy rich regions. Preferably, the pre-implant laser process is optimized so that the depth of the vacancy rich region substantially matches the depth of end of range defect regions associated with subsequently formed amorphous regions. The desired location of subsequently formed amorphous regions is represented in FIG. 6f by dotted lines.

In one embodiment, the incident laser beam melts a portion of the substrate to form vacancy rich regions 655 around the maximum melting depth of the laser. It is to be understood that a multitude of laser process parameters, such as but not limited to wavelength, beam energy, irradiation duration and number of pulses, can be adjusted to modulate the depth of vacancy rich regions 655. Moreover, those skilled in the art will appreciate that laser process parameters can vary with the optical coating layer material employed, substrate material employed, for example.

Figure 6F:
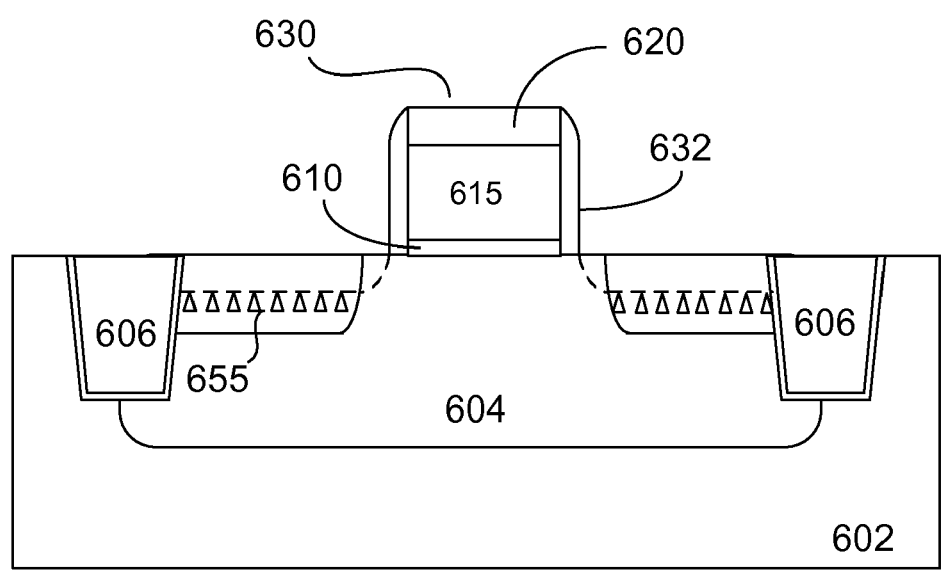

In FIG. 6f, the optical coating layer 640, and the gate capping layer 620 formed are removed after the pre-implant laser step.

Figure 6G:
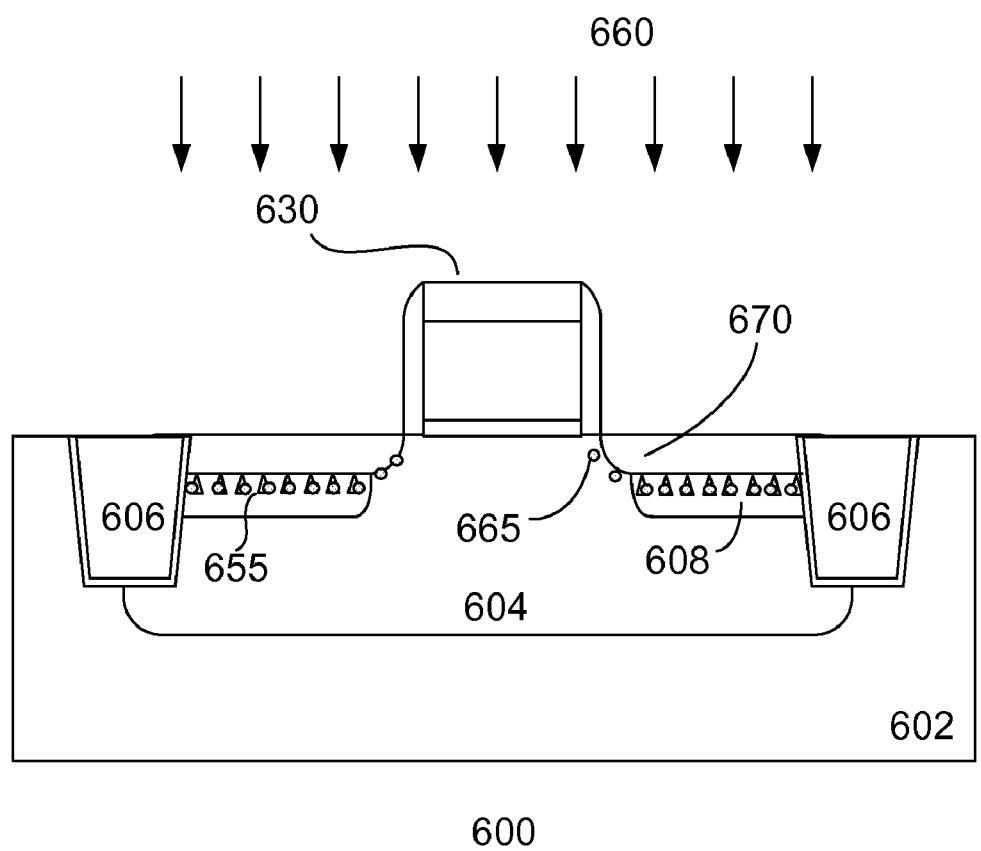

Referring now to FIG. 6g, therein is shown the structure of FIG. 6f in a pre-amorphization implant step. Arrows 660 depict the implantation of a second ion species such as Ge, Si or an inert gas such as Ne, Ar, Kr so as to form amorphous regions 670 on opposed sides of the gate stack 630. Amorphous regions 670 represent areas where the crystalline structure of the substrate 602 has been transformed a random state. Pre-amorphization implant is commonly used to reduce the channeling effects whereby implanted ions (e.g. Boron) penetrate to a greater depth than projected. By reducing the extent of channeling shallower junctions may be formed.

However, the pre-amorphization implant step results in the generation of end of range (EOR) defect regions which are located approximately at or as illustrated in FIG. 6g slightly below the depth of the amorphous region 670. The EOR regions comprise defects such as interstitials 665. Interstitials 665 in the EOR region are undesirable because they decrease the electrical activation of implanted dopant ions by assisting in the segregation and/or clustering of the dopants. Interstitials 665 also cause transient enhanced diffusion of dopants during subsequent anneal steps thus increasing junction depth. For example, interstitials 665 in the EOR region may decrease the electrical activation of dopants used to form a source/drain extension region in a subsequent step and contribute to transient enhanced diffusion thereof during anneal. Transient enhanced diffusion of source/drain extension dopants increases the dimensions of source/drain extension regions.

The vacancies 655 generated at the laser melting depth remove interstitials 665 in the EOR region thereby permitting superior electrical activation of dopants used to form the source/drain extension regions in subsequent steps by creating more sites where the dopants can become electrically active. In addition, by removing interstitials, the vacancies 665 also suppress interstitial aided transient enhanced diffusion. In one embodiment of the present embodiment as shown in FIG. 6g, the pre-amorphization implant process can be optimized such that the EOR region depth is proximate to the depth of the vacancy rich region 655. The depth of the vacancy rich region 655 may be equal to the laser melting depth of the pre-implant laser step. Preferably, EOR region depth is approximately equal to the depth of the vacancy rich region. Alternatively, the laser melting depth may be tuned to match the EOR region depth.

Following the pre-amorphization implant step, third dopant species are implanted into the substrate to form source/drain extension regions on opposed side of the gate stack 630. In FIG. 6g, the source/drain extension as implanted completely overlaps the amorphous regions 670. Alternatively, the source/drain extension may also have other dimensions so long as it overlaps the amorphous region. Preferably, the amorphous region is deeper than the source/drain extension region as implanted.

In one embodiment, a PFET device is fabricated and the source/drain extension regions 670 may be formed by implanting lightly doped P-type impurity ions. Non-limiting examples of P-type dopants include Boron, Aluminum, Gallium, Indium or compounds thereof. In another embodiment, an NFET is fabricated the third dopant species are lightly doped N-type impurity ions. Non-limiting examples of N-type dopants include Phosphorus, Arsenic or compounds thereof.

After the source and drain extension implant step, an annealing process such as annealing processes such as low temperature thermal anneal, rapid thermal anneal, spike anneal, flash anneal or laser anneal is carried out to activate the source and drain extension dopants.

FIG. 6h(i) shows a post anneal embodiment of the invention where pre-implant laser processing was carried out to generate vacancies while FIG. 6h(ii) shows an embodiment without pre-implant laser processing. As evident from the illustration, FIG. 6h(i) has a reduced number of interstitial defects compared to FIG. 6h(ii). Consequently, the post anneal source/drain extension region for FIG. 6h(i) is of a shallower depth and has a higher percentage of dopant activation compared to the source/drain extension region for FIG. 6h(ii).

FIGS. 7a to 7i are cross-sectional views illustrating process steps for fabricating a field effect transistor (FET) in accordance with second embodiment of the present invention. In this second embodiment, a sacrificial replacement gate is used thus eliminating the need for an optical coating layer to prevent the gate electrode from melting during laser processing. It is to be understood that a plurality of conventional processes that are well known in the art and not repeated herein, may precede or follow FIGS. 7a-7i. Moreover, it is to be understood that many modifications, additions, and/or omissions may be made to the below described process without departing from the scope or spirit of the claimed subject matter. For example, the below described process may include more, fewer, or more steps. Also, it is to be appreciated that the present disclosure need not be limited to the initial semiconductor structure depicted by FIG. 7a.

Figure 7A:
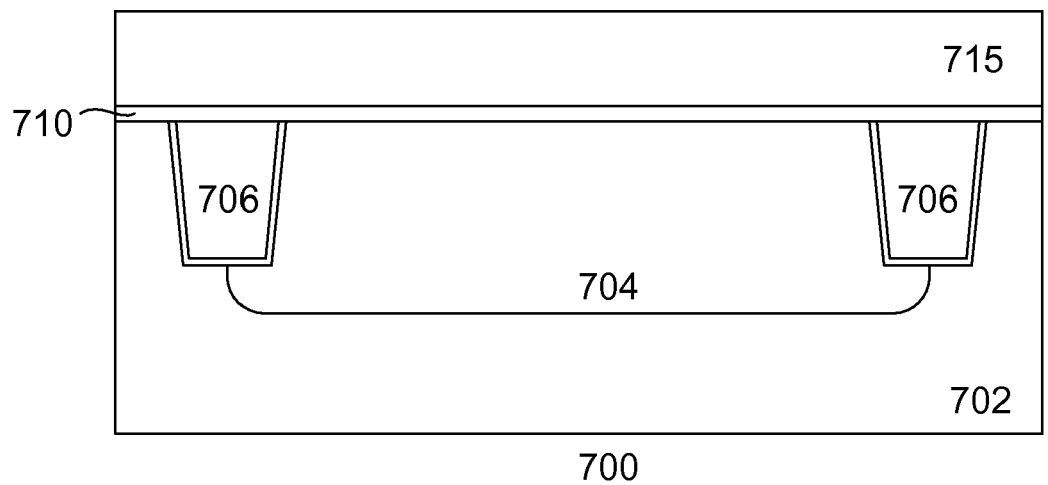
FIGS. 7a to 7i are schematic cross-sectional views illustrating the results of progressive stages in fabricating a semiconductor structure in accordance with a second embodiment of the invention.

Referring now to FIG. 7a, therein is shown schematic cross-sectional view of a semiconductor structure 600 comprising a semiconductor substrate 702 including a well 704 formed within. In one embodiment, the substrate 702 comprises a P-type bulk silicon substrate having an N-well in which PMOS devices may be formed. Alternatively, other bulk semiconductor materials or a compound semiconductor materials such as but not limited to germanium, silicon carbide, gallium arsenide or indium arsenide may also be used for the substrate 702. The substrate 702 may also be a silicon on insulator substrate.

Trench isolation structures 706 are formed within the substrate to isolate active areas on the substrate 702. Alternatively, other isolation structures such as field oxide isolation structures may also be used.

A gate dielectric layer 710 is deposited over a substrate 702 followed by the formation of a layer of dummy gate electrode material 715 over the gate dielectric layer 710. The gate dielectric layer 710 may comprise a dielectric material such as silicon dioxide, silicon oxynitride, silicon nitride, a high-K metal oxide or a combination thereof. Alternatively, other dielectric materials may also be used. The gate dielectric 710 may be deposited using methods such as thermal oxidation, chemical vapour deposition, rapid thermal oxidation or the like as known in the art. As for the dummy gate electrode layer 715, materials such as polysilicon, SiGe, SiN or SiC may be used. Alternatively, other materials that may be removed selectively with respect to spacers subsequently formed on the sidewalls of a dummy gate stack which the dummy gate electrode forms part of may also be used.

Figure 7B:
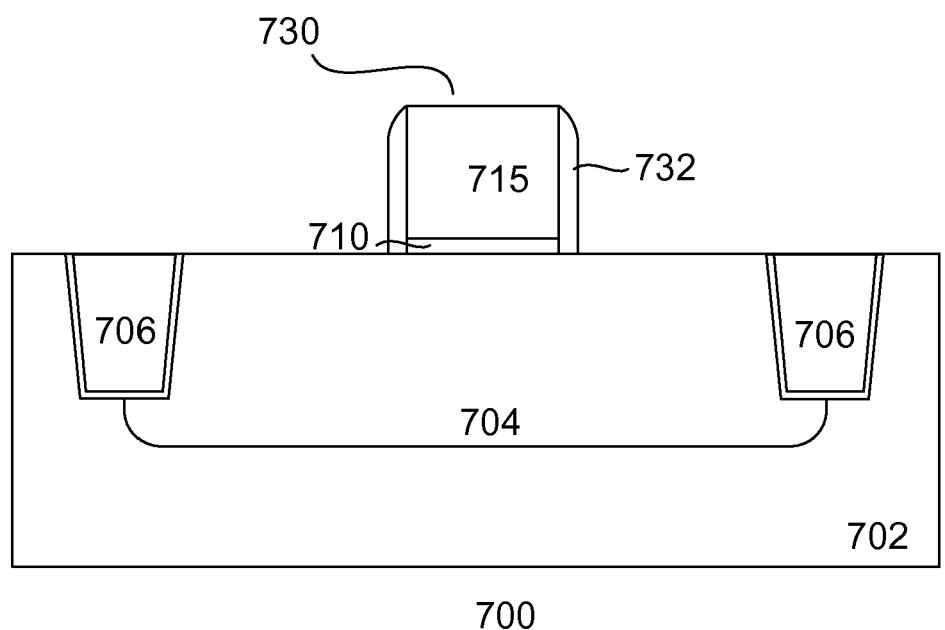

FIG. 7b shows the results of patterning the gate dielectric layer 710, and dummy gate electrode layer 715 of FIG. 7a to form a dummy gate stack 730. Conventional patterning methods such as lithography patterning using photoresist followed by selective sequential etching of the dummy gate electrode layer 715 and the gate dielectric layer 710 may be used to define the dummy gate stack 730. After etching is completed, the photoresist mask is stripped off. A blanket layer of dielectric material is subsequently deposited over the gate stack 730 and substrate 702 and patterned by performing an anisotropic or isotropic etch process to form first offset spacers 732 adjacent the sidewalls of the dummy gate electrode. The first offset spacers 732 serve as an implant mask for subsequent pre-amorphization and source drain extension implant steps. By way of example, the first offset spacers 732 may comprise a silicon nitride, silicon oxide, silicon oxynitride or a combination thereof. Alternatively, other dielectric materials may also be used.

Figure 7C:
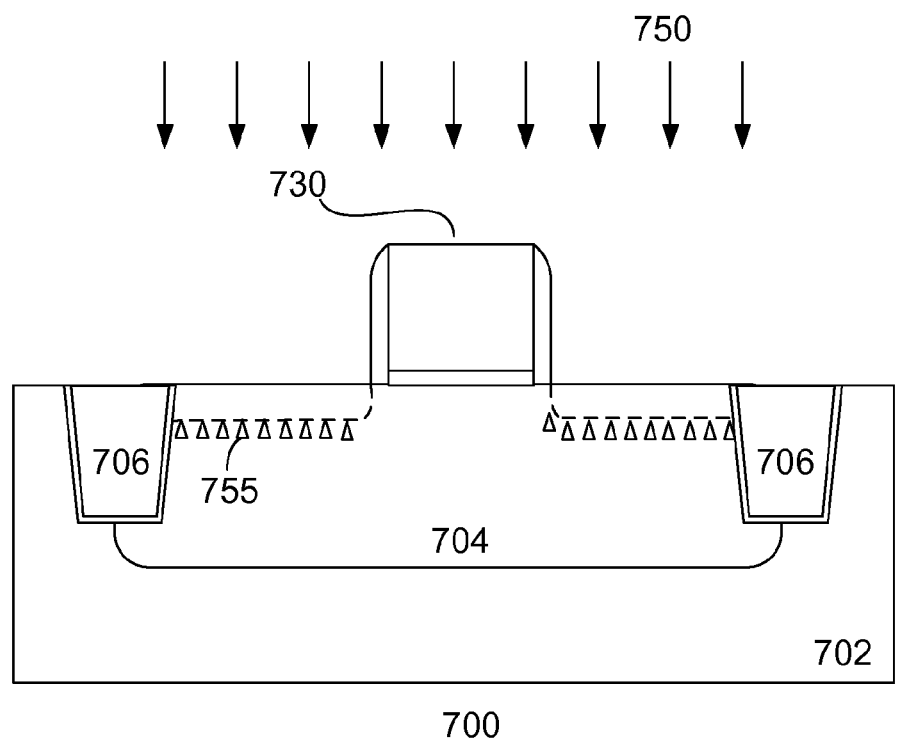

Referring now to FIG. 7c, therein is shown the semiconductor structure 700 of FIG. 7b in a pre-implant laser step. Arrows 750 depict the irradiation of laser fluence in a laser process that has been optimized to create vacancy rich regions 755 on opposing sides of the gate stack 730. Preferably, the pre-implant laser process is optimized to locate the greatest concentration of vacancies at end of range defect regions associated with a subsequent pre-amorphization implant step that forms an amorphous region. The location of the subsequently formed amorphous regions is denoted in FIG. 7c by dotted lines.

In one embodiment, the incident laser beam 750 melts a portion of the substrate to form vacancy rich regions 755 around the maximum melting depth of the laser. It is to be understood that a multitude of laser process parameters, such as but not limited to wavelength, beam energy, irradiation duration and number of pulses, can be adjusted to modulate the depth of vacancy rich regions 755. Moreover, those skilled in the art will appreciate that laser process parameters can vary with the substrate material employed, for example.

Figure 7D:
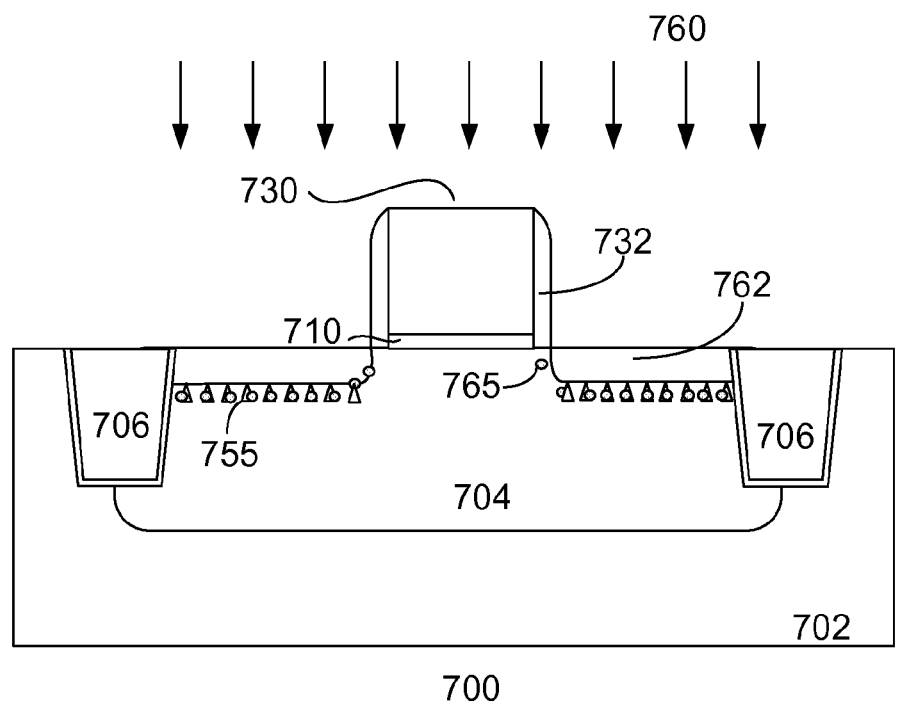

Referring now to FIG. 7d, therein is shown the structure of FIG. 7c in a pre-amorphization implant step. Arrows 760 depict the implantation of a first ion species such as Ge, Si or an inert gas such as Ne, Ar, Kr so as to form amorphous regions 762 on opposed sides of the dummy gate stack 730. Amorphous regions 762 represent areas where the crystalline structure of the substrate 702 has been transformed a random and amorphous state. Pre-amorphization implant is commonly used to reduce the channeling effect.

However, the pre-amorphization implant step results in the generation of end of range (EOR) defect regions which are located approximately at or as illustrated in FIG. 7d slightly below the depth of the amorphous region 762. The EOR regions comprise defects such as interstitials 765. Interstitials 765 in the EOR region are undesirable because they decrease the electrical activation of implanted dopant ions by assisting in the segregation and/or clustering of the dopants. Interstitials 765 also cause transient enhanced diffusion of dopants during subsequent anneal steps thus increasing junction depth. For example, interstitials 765 in the EOR region may decrease the electrical activation of subsequently introduced dopants used to form a source/drain extension region and contribute to transient enhanced diffusion thereof during anneal. Transient enhanced diffusion of source/drain extension dopants increases the dimensions of source/drain extension regions.

The vacancies in the vacancy rich region 755 remove interstitials 765 in the EOR region thereby permitting superior electrical activation of dopants used to form the source/drain extension regions in subsequent steps by creating more sites where the dopants can become electrically active. In addition, by removing interstitials, the vacancies 755 also suppress interstitial aided transient enhanced diffusion. In a preferred aspect of the present embodiment as shown in FIG. 7d, the pre-amorphization implant process can be optimized such that the EOR region depth is approximately equal to the location of the vacancy rich regions which may be determined by the pre-implant laser step's laser melting depth. Alternatively, the laser melting depth may be tuned to match the EOR region depth.

Following the pre-amorphization implant step, second dopant species are implanted into the substrate to form source/drain extension regions 762 on opposed side of the gate stack 730. In FIG. 7d, the source/drain extension region as implanted completely overlaps the amorphous regions 762. Alternatively, the source/drain extension may also have other dimensions so long as it overlaps the amorphous region. Preferably, the amorphous region is deeper than the source/drain extension region as implanted.

In one embodiment, a PFET device is fabricated and the source/drain extension regions 762 may be formed by implanting lightly doped P-type impurity ions. Non-limiting examples of P-type dopants include Boron, Aluminum, Gallium, Indium or compounds thereof. In another embodiment, an NFET is fabricated and the second dopant species are lightly doped N-type impurity ions. Non-limiting examples of N-type dopants include Phosphorus, Arsenic or compounds thereof.

Figure 7E:
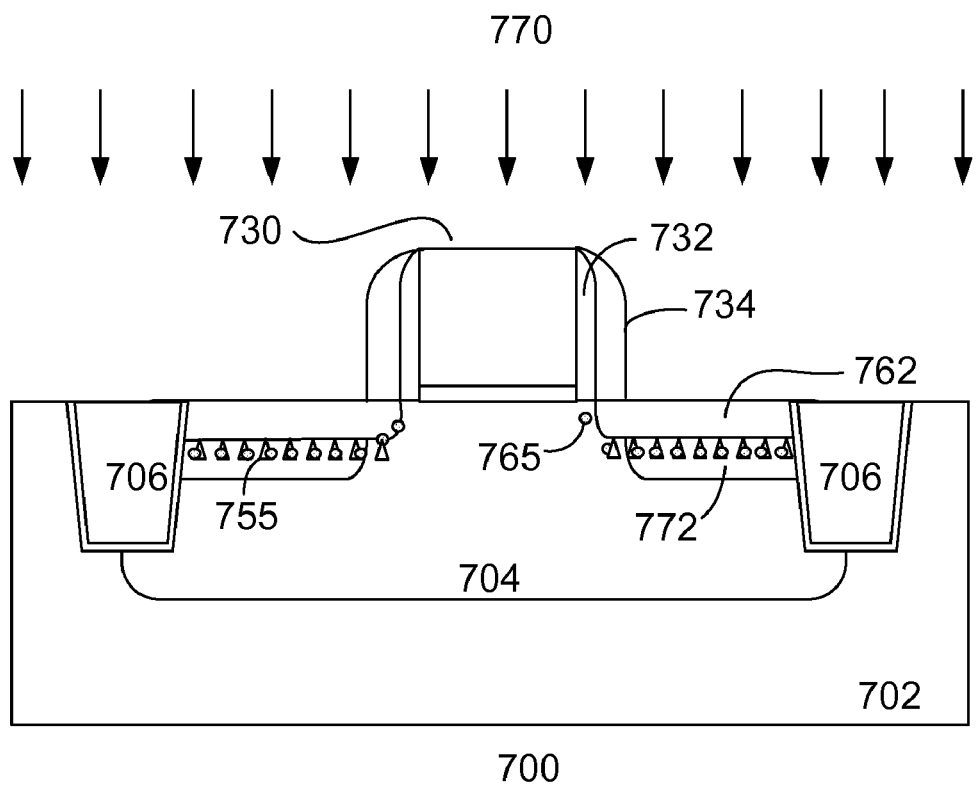

FIG. 7e shows the semiconductor structure 700 of FIG. 7d after second offset spacers 734 are formed adjacent the sidewalls of the first offset spacer 732. The second offset spacers may be formed by depositing a blanket layer of dielectric material over the semiconductor structure 700 of FIG. 7d followed by an anisotropic or isotropic etch process to. By way of example, the second offset spacers 734 may comprise a silicon nitride, silicon oxide, silicon oxynitride or a combination thereof. Alternatively, other dielectric materials may also be used.

As shown in FIG. 7e, the second offset spacers serve as an implant mask during a deep source/drain implantation step where third dopant species as depicted by arrows 770 are implanted into the substrate. The deep source/drain implantation step forms deep source/drain diffusion regions 772 which are offset from the edge of the gate electrode by the first and second offset spacers (732, 734).

In one embodiment, a PFET device is fabricated and the deep source/drain regions 772 may be formed by implanting heavily doped P-type impurity ions. Non-limiting examples of P-type dopants include Boron, Gallium, Indium or compounds thereof. In another embodiment, an NFET is fabricated and the third dopant species are heavily doped N-type impurity ions. Non-limiting examples of N-type dopants include Phosphorus, Arsenic or compounds thereof.

After the deep source/drain extension implant step, the dopants in the source/drain extension and deep source/drain regions are activated by an annealing process. By way of example, the annealing process may be a low temperature thermal anneal, rapid thermal anneal, spike anneal, flash anneal or laser anneal process.

Figure 7F:
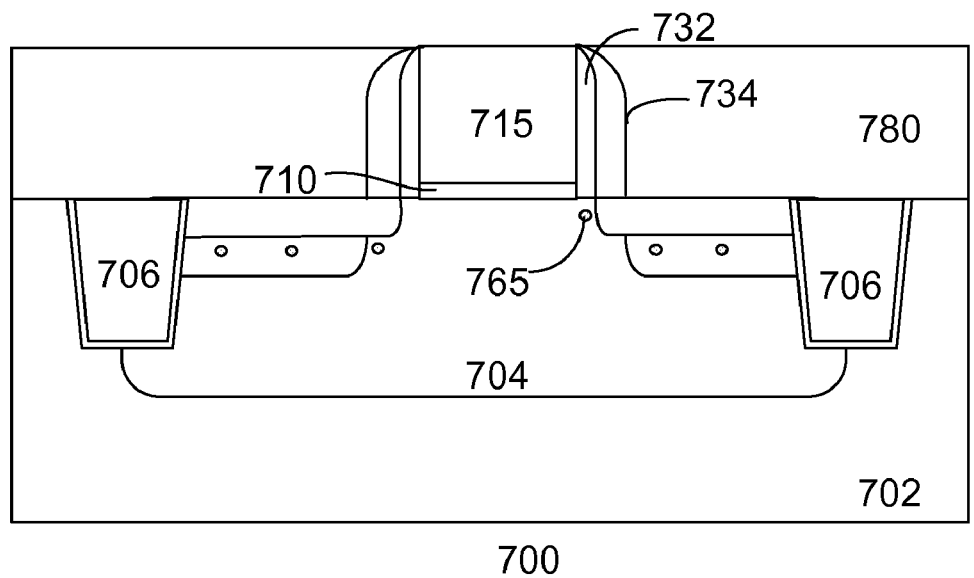

Referring to FIG. 7f, therein is shown the structure of FIG. 7e after a first dielectric layer 780 is deposited over the substrate. The first dielectric layer 825 as deposited completely covers the dummy gate stack 730 and is subsequently recessed through a CMP or etch back process to expose a top surface of the dummy gate electrode 715. By way of example, the first dielectric layer may include a low k dielectric material, an oxygen containing material such as silicon dioxide, TEOS, silicon nitride or a combination thereof.

Figure 7G:
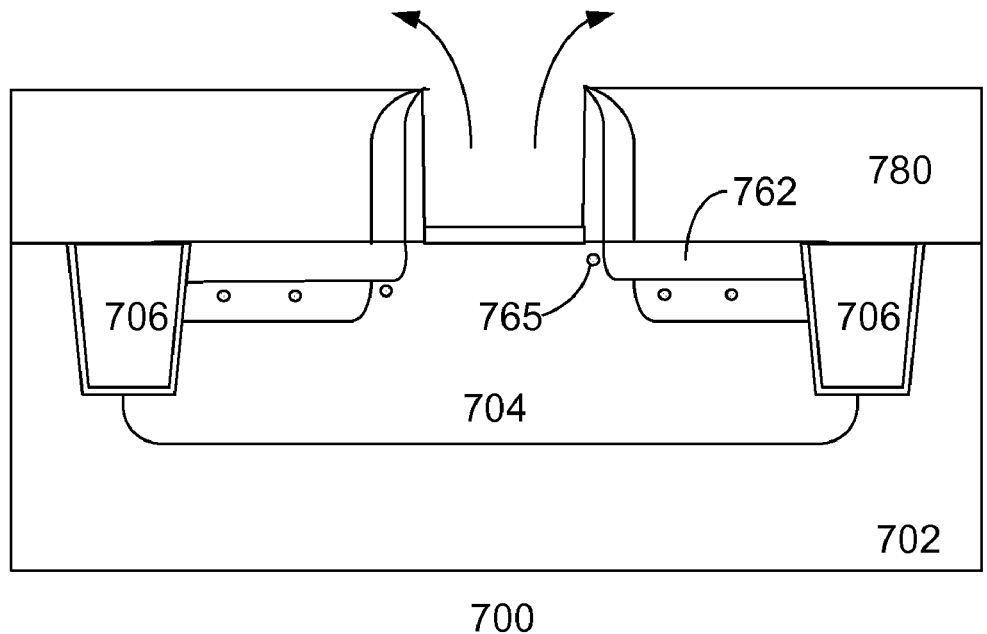

In FIG. 7g, the dummy gate electrode 715 is removed in an etch process that selectively removes the dummy gate electrode material while retaining the gate dielectric 710, first offset spacer 732, second offset spacer 734 and first dielectric layer 780. In one embodiment, the dummy gate electrode material is removed by a wet etch process.

Figure 7H:
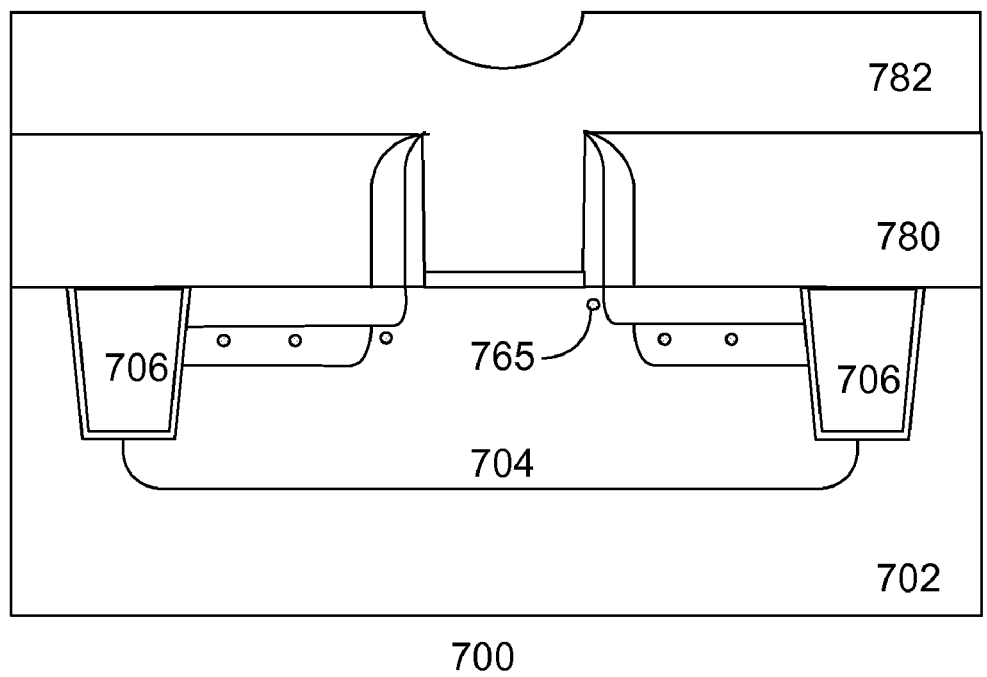

Referring now to FIG. 7h, a layer of gate electrode material 782 is deposited over the semiconductor structure 700 of FIG. 7g. The gate electrode material 782 fills the void left behind by removing the dummy gate electrode and also covers the top of the first dielectric layer 780. The gate electrode layer 782, it may comprise a conductive or semi-conductive material. Preferably, the gate electrode material comprises polysilicon, metal or metal alloy. Although a unilayer of gate electrode material is illustrated in FIG. 7h, it is to be understood that a composite layer of gate electrode material may be deposited instead.

Figure 7I:
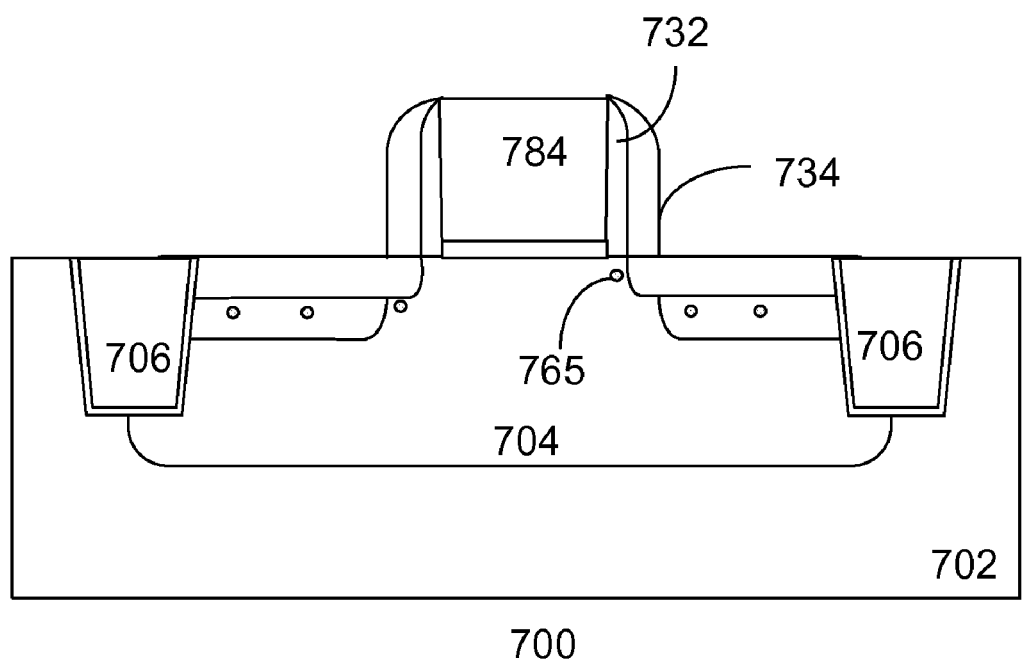

Referring to FIG. 7i, a gate electrode is formed by recessing the gate electrode layer 782 of FIG. 7h so that the top of the first dielectric layer 780 is exposed. In one embodiment, a chemical mechanical polishing process may be used to recess the gate electrode layer 782. The exposed first dielectric layer 780 is subsequently removed thus providing the structure as shown in FIG. 7i. In one embodiment, the first dielectric layer may be removed by a wet etch process. In another non-illustrated embodiment, the first dielectric layer 780 forms part of an inter layer dielectric layer separating a first metal layer from the substrate.

FIGS. 8a to 8j are cross-sectional views illustrating process steps for fabricating a field effect transistor (FET) in accordance with third embodiment of the present invention. In this third embodiment, the FET comprises a metal based gate electrode which does not melt during when a semiconductor structure is subjected to a vacancy-forming laser process.

Accordingly, the need for an optical coating layer to prevent the gate electrode from melting during laser processing may be eliminated. It is to be understood that a plurality of conventional processes that are well known in the art and not repeated herein, may precede or follow FIGS. 8a-8j. Moreover, it is to be understood that many modifications, additions, and/or omissions may be made to the below described process without departing from the scope or spirit of the claimed subject matter. For example, the below described process may include more, fewer, or more steps. Also, it is to be appreciated that the present disclosure need not be limited to the initial semiconductor structure depicted by FIG. 8a.

Figure 8A:
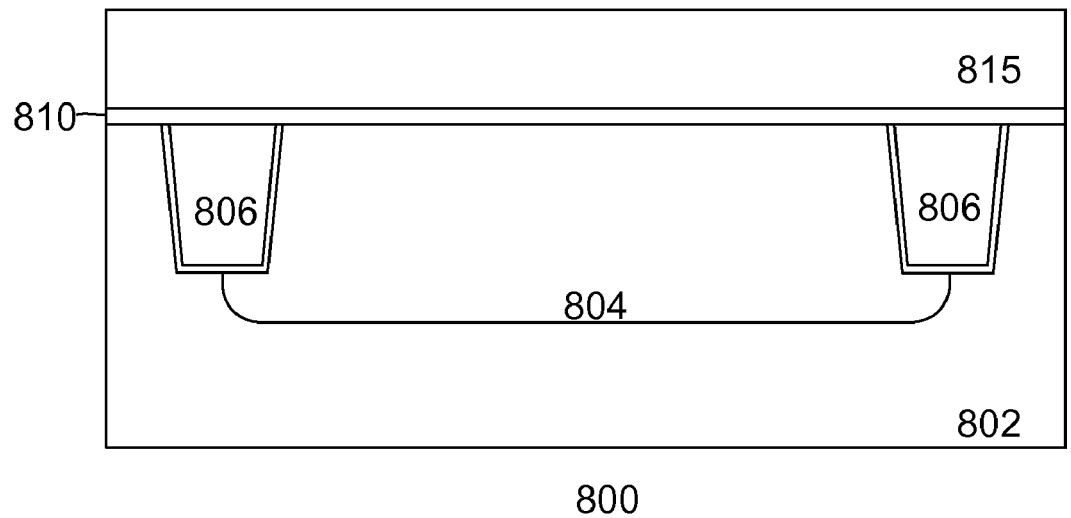
FIGS. 8a to 8k are schematic cross-sectional views illustrating the results of progressive stages in fabricating a semiconductor structure in accordance with a third embodiment of the invention.

Referring now to FIG. 8a, therein is shown schematic cross-sectional view of a semiconductor structure 800 comprising a semiconductor substrate 802 including a well 804 formed within. In one embodiment, the substrate 802 comprises a P-type bulk silicon substrate having an N-well in which PMOS devices may be formed. Alternatively, other bulk semiconductor materials or a compound semiconductor materials such as but not limited to germanium, silicon carbide, gallium arsenide or indium arsenide may also be used for the substrate 802. The substrate 802 may also be a silicon on insulator substrate.

Trench isolation structures 806 are formed within the substrate to isolate active areas on the substrate 802. Alternatively, other isolation structures such as field oxide isolation structures may also be used.

A gate dielectric layer 810 is deposited over a substrate 802 followed by the formation of a layer of dummy gate electrode material 815 over the gate dielectric layer 810. The gate dielectric layer 810 may comprise a dielectric material such as silicon dioxide, silicon oxynitride, silicon nitride, a high-K metal oxide or a combination thereof. Alternatively, other dielectric materials may also be used. The gate dielectric 810 may be deposited using methods such as thermal oxidation, chemical vapour deposition, rapid thermal oxidation or the like as known in the art. As for the dummy gate electrode layer 815, materials such as polysilicon, SiGe, SiN or SiC may be used. Alternatively, other materials that may be removed selectively with respect to spacers subsequently formed on the sidewalls of a dummy g ate stack which the dummy gate electrode forms part of may also be used.

Figure 8B:
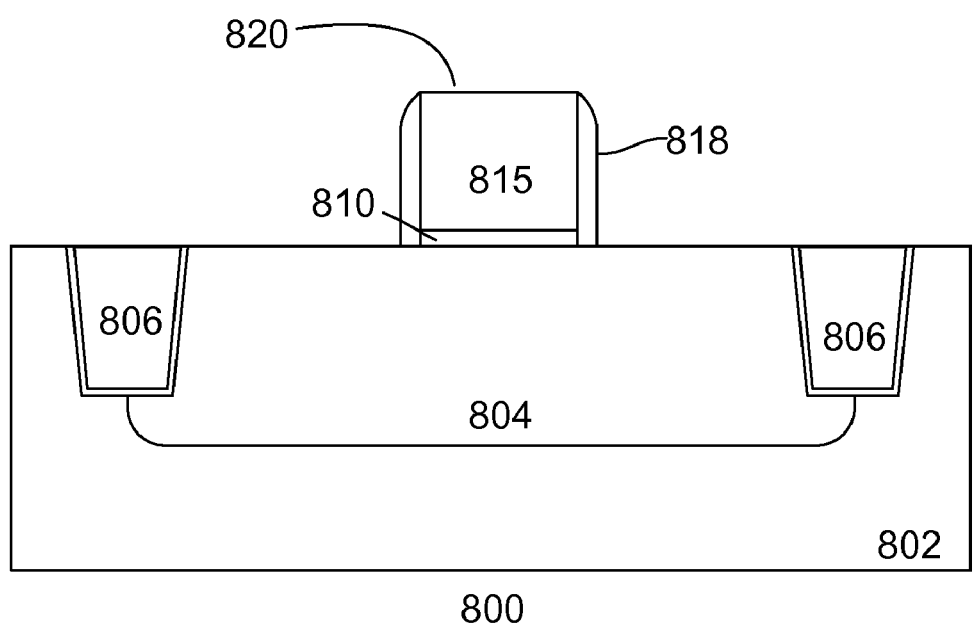

FIG. 8b shows the results of patterning the gate dielectric layer 810, and dummy gate electrode layer 815 of FIG. 8a to form a dummy gate stack 820. Conventional patterning methods such as lithography patterning using photoresist followed by selective sequential etching of the dummy gate electrode layer 815 and the gate dielectric layer 810 may be used to define the dummy gate stack 820. After etching is completed, the photoresist mask is stripped off. A blanket layer of dielectric material is subsequently deposited over the gate stack 820 and substrate 802, and the layer of dielectric material is patterned by performing an anisotropic or isotropic etch process to form first offset spacers 818 adjacent the sidewalls of the dummy gate electrode. The first offset spacers 818 serve as an implant mask for subsequent pre-amorphization and source/drain extension implant steps. By way of example, the first offset spacers 818 may comprise a silicon nitride, silicon oxide, silicon oxynitride or a combination thereof. Alternatively, other dielectric materials may also be used.

Figure 8C:
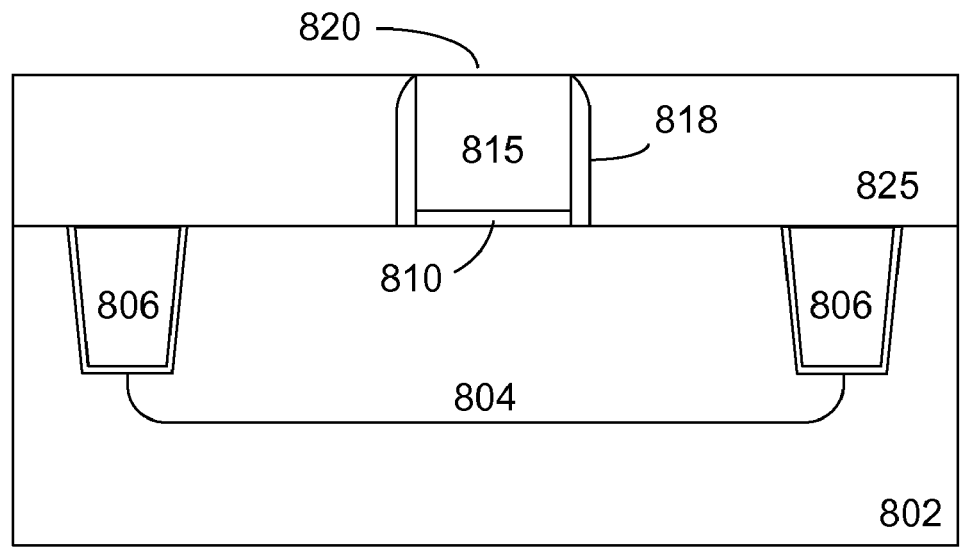

Referring to FIG. 8c, therein is shown the structure of FIG. 7b after a first dielectric layer 825 is deposited over the substrate. The first dielectric layer 825 as deposited completely covers the dummy gate stack 820 and is subsequently recessed through a CMP or etch back process so that the top surface of the dummy gate electrode 815 is exposed. By way of example, the first dielectric layer may include a low k dielectric material, an oxygen containing material such as silicon dioxide, TEOS, silicon nitride or a combination thereof.

Figure 8D:
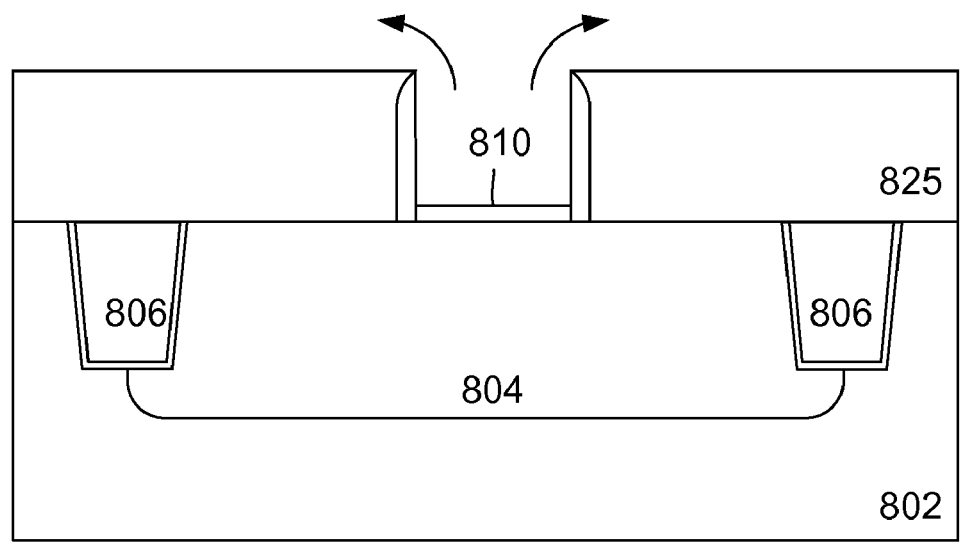

In FIG. 8d, the dummy gate electrode 815 is removed in an etch process that selectively removes the dummy gate electrode material while retaining the gate dielectric 810, first offset spacer 818, and first dielectric layer 825. In one embodiment, the dummy gate electrode material 815 is removed by a wet etch process.

Figure 8E:
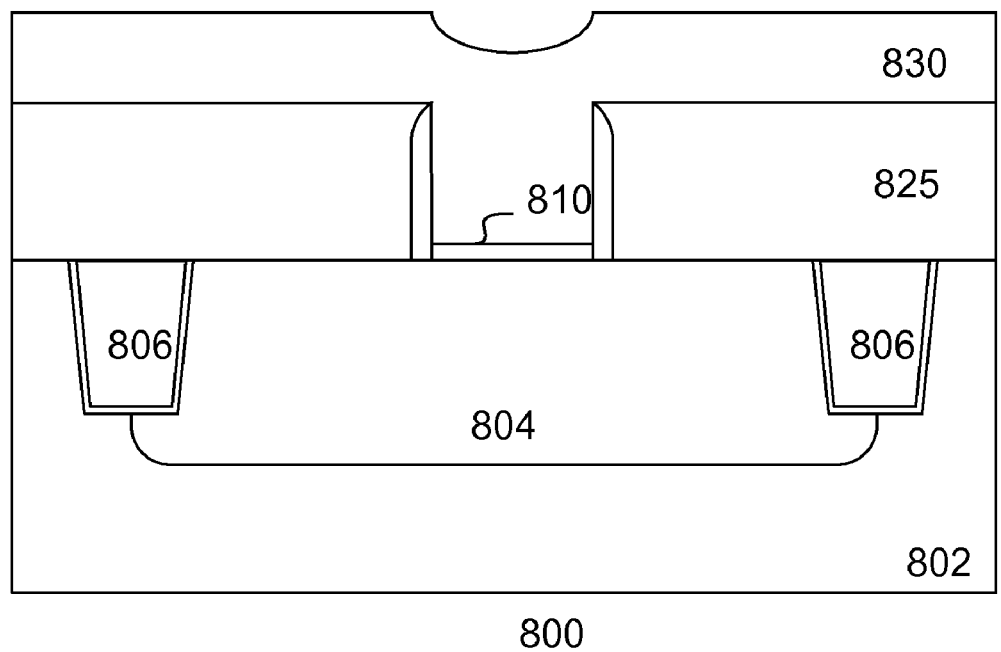

Referring now to FIG. 8e, a layer of metal-based gate electrode material 830 is deposited over the semiconductor structure 800 of FIG. 8d. The gate electrode material 830 fills the void between the offset spacers that is created by the removal of the dummy gate electrode material, and also covers the top of the first dielectric layer 825. In one embodiment, a PFET device is fabricated and the gate electrode material may comprise TiAlN, WCN, Ni, Pd, Rd, or a combination thereof. In another embodiment, a NFET is fabricated and the gate electrode material may comprise Ti, Ta, Al, TaN, or a combination thereof Alternatively, other metals or metal alloys which are suitable for use as a gate electrode may also be used. The metal-based gate electrode materials may be deposited by methods such as physical vapor deposition, chemical vapor deposition or atomic layer deposition.

Figure 8F:
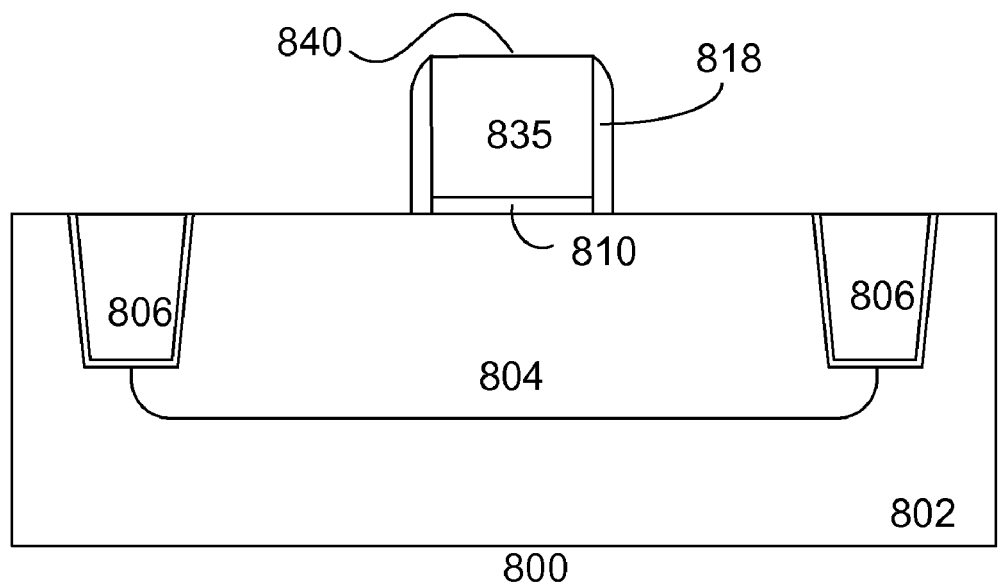

A gate electrode is formed by recessing the gate electrode layer 830 of FIG. 8f so that the top of the first dielectric layer 825 is exposed. In one embodiment, a chemical mechanical polishing process may be used to recess the gate electrode layer 830. The exposed first dielectric layer 825 is subsequently removed thus providing the second gate stack 840 as shown in FIG. 8f. In one embodiment, the first dielectric layer 825 is removed in a wet etch process.

Figure 8G:
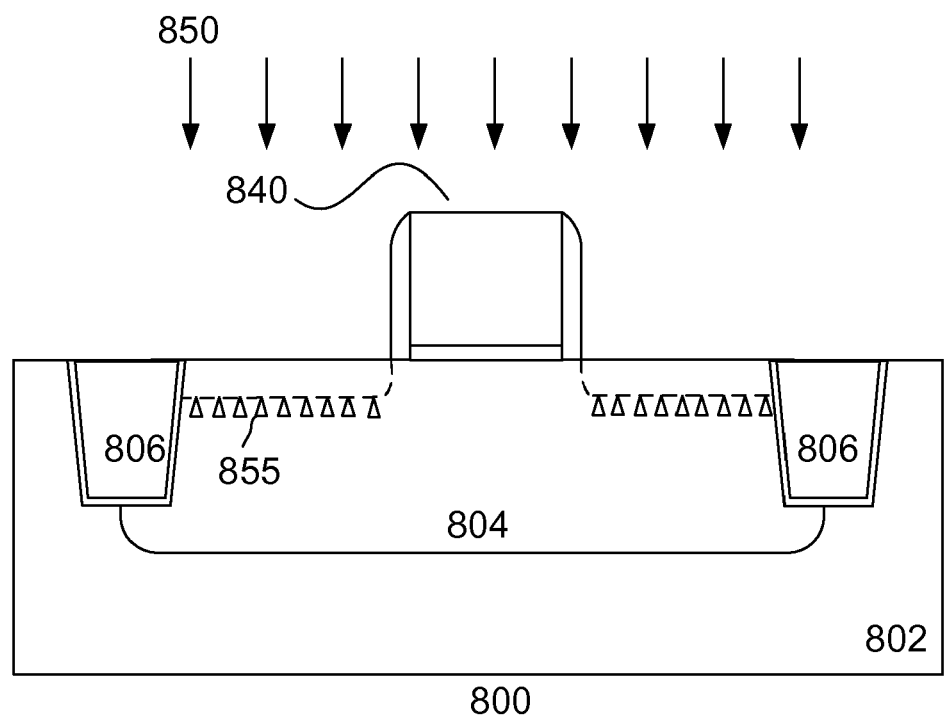

Referring now to FIG. 8g, therein is shown the semiconductor structure 800 of FIG. 8f in a first pre-implant laser step. Arrows 850 depict the irradiation of laser fluence in a laser process that has been optimized to create vacancy rich regions 855 on opposing sides of the second gate stack 840. Preferably, the pre-implant laser process is optimized so that the location of the vacancy rich regions substantially matches the location of end of range defect regions generated by a subsequent pre-amorphization implant step. The location of an amorphous region formed by the subsequent pre-amorphization implant step is denoted by dotted lines.

In one embodiment, the incident laser beam 850 melts a portion of the substrate to form vacancy rich regions 855 around the maximum melting depth of the laser. It is to be understood that a multitude of laser process parameters, such as but not limited to wavelength, beam energy, irradiation duration and number of pulses, can be adjusted to modulate the depth of vacancy rich regions 855. Moreover, those skilled in the art will appreciate that laser process parameters can vary with the substrate material employed, for example.

Figure 8H:
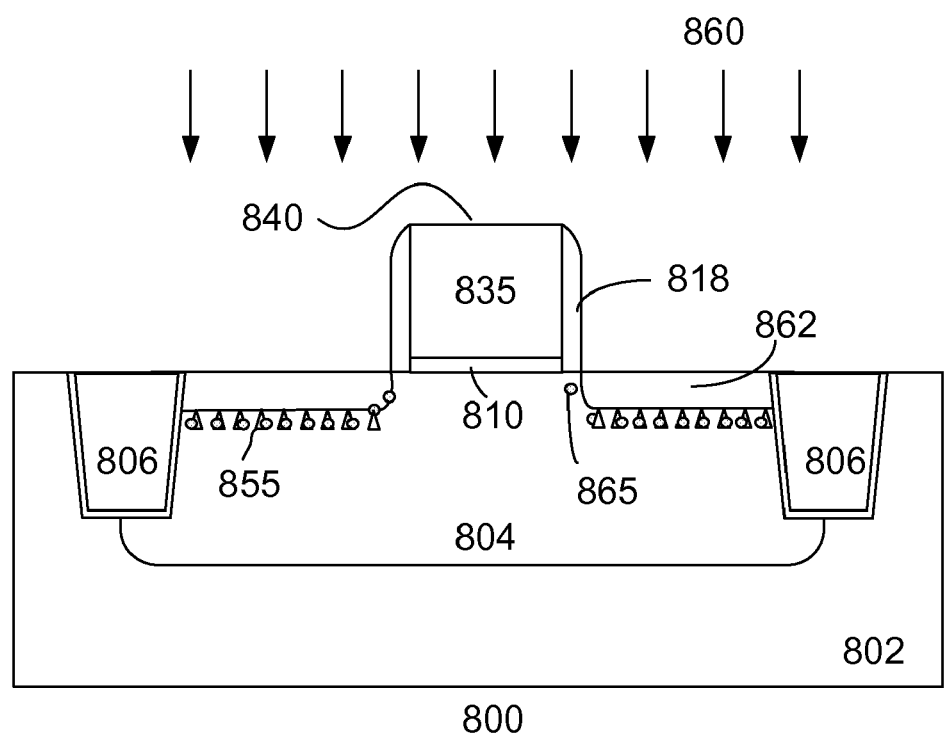

Referring now to FIG. 8h, therein is shown the structure of FIG. 8g in a pre-amorphization implant step. Arrows 860 depict the implantation of a first ion species such as Ge, Si or an inert gas such as Ne, Ar, Kr so as to form amorphous regions 862 on opposed sides of the gate stack 840. Amorphous regions 862 represent areas where the crystalline structure of the substrate 802 has been transformed a random state. Pre-amorphization implant is commonly used to reduce the channeling effects.

However, the pre-amorphization implant step results in the generation of end of range (EOR) defect regions which are located approximately at or as illustrated in FIG. 8h slightly below the depth of the amorphous region 862. The EOR regions comprise defects such as interstitials 865. Interstitials 865 in the EOR region are undesirable because they decrease the electrical activation of implanted dopant ions by assisting in the segregation and/or clustering of the dopants. Interstitials 865 also cause transient enhanced diffusion of dopants during subsequent anneal steps thus increasing junction depth. For example, interstitials 765 in the EOR region may decrease the electrical activation of subsequently introduced dopants used to form a source/drain extension region and contribute to transient enhanced diffusion thereof during anneal. Transient enhanced diffusion of source/drain extension dopants increases the dimensions of source/drain extension regions.

The vacancies in the vacancy rich region 855 remove interstitials 865 in the EOR region thereby permitting superior electrical activation of dopants used to form the source/drain extension regions in subsequent steps by creating more sites where the dopants can become electrically active. In addition, by removing interstitials, the vacancies 855 also suppress interstitial aided transient enhanced diffusion. In a preferred aspect of the present embodiment as shown in FIG. 8h, the pre-amorphization implant process can be optimized such that the EOR region depth is approximately equal to the depth of the vacancy rich regions 855. In one embodiment, the depth of the vacancy rich regions corresponds to the laser melting depth of the pre-implant laser step. Alternatively, the laser melting depth may be tuned to match the EOR region depth.

Following the pre-amorphization implant step, second dopant species are implanted into the substrate to form source/drain extension regions 862 on opposed side of the gate stack 840. In FIG. 8h, the source/drain extension region as implanted completely overlaps the amorphous regions 862. Alternatively, the source/drain extension may also have other dimensions so long as it overlaps the amorphous region. Preferably, the amorphous region is deeper than the source/drain extension region as implanted.

In one embodiment, a PFET device is fabricated and the source/drain extension regions 862 may be formed by implanting lightly doped P-type impurity ions. Non-limiting examples of P-type dopants include Boron, Aluminum, Gallium, Indium or compounds thereof. In another embodiment, an NFET is fabricated and the second dopant species are lightly doped N-type impurity ions. Non-limiting examples of N-type dopants include Phosphorus, Arsenic or compounds thereof.

Figure 8I:
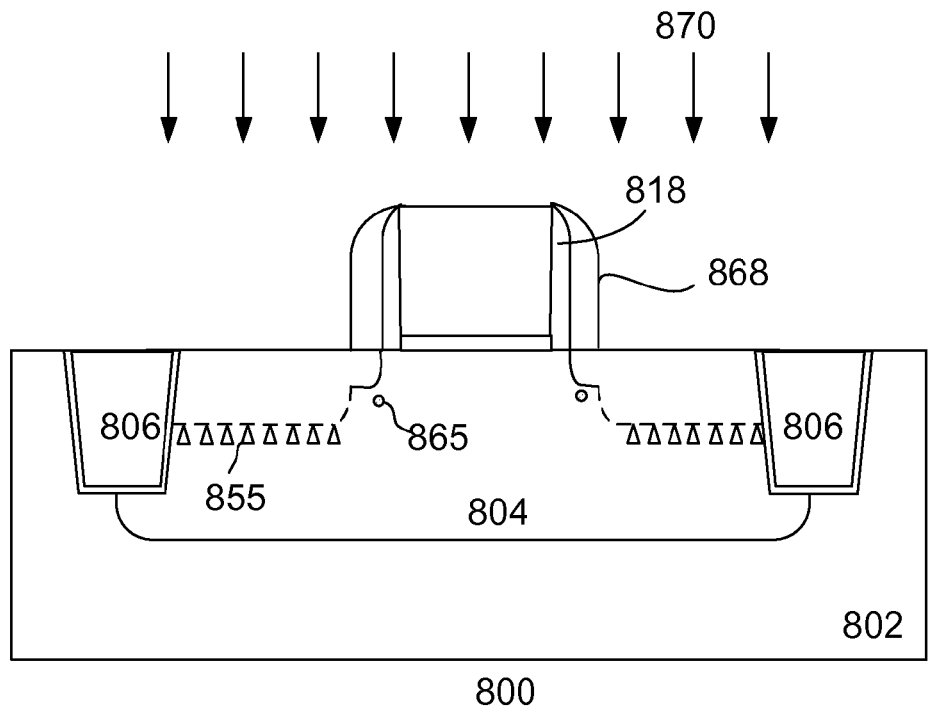

After implanting the source/drain extension dopants, second offset spacers 868 are formed alongside the external sidewalls of the first offset spacers 818 as shown in FIG. 8i, thus providing a gate stack 840 comprising the gate dielectric 810, gate electrode 815, and first and second offset spacers (818, 868). The second offset spacers 868 act as an implant mask during a subsequent deep source/drain implant step.

Subsequent to the formation of the second offset spacers 868, a second pre-implant laser step as depicted by arrows 870 is carried out. The second pre-implant laser step is optimized to create second vacancy rich regions 875 on opposed sides of the gate stack 840. The objective of the second pre-implant laser step is to mitigate transient enhanced diffusion and dopant deactivation effects associated with an end of range region generated by a subsequent deep source/drain implant. Accordingly, the second vacancy rich regions 875 are aligned with the location of desired deep source/drain regions which are represented in FIG. 8i by dotted lines. Preferably, the second pre-implant laser process is optimized so that the location of the second vacancy rich regions substantially matches the location of end of range defect regions generated by the subsequent deep source/drain implant step. In one embodiment, the second pre-implant laser process has an annealing effect and it results in the activation of at least some of the second dopant species forming the source/extension region 862. The extent of dopant activation depends on factors such as energy of laser fluence, duration of laser pulse and laser melting temperature.

In one embodiment, the incident laser beam 870 melts a portion of the substrate to form second vacancy rich regions 875 with a depth denoted by the maximum melting depth of the laser. Preferably, the maximum melt depth substantially matches the location of end of range defect regions generated by a subsequent deep source/drain implant step. In the embodiment of FIG. 8i, the second vacancy rich regions 875 are formed at a greater depth compared to the first vacancy rich regions 855, accordingly, a higher laser fluence may be required compared to the first pre-implant laser step.

It is to be understood that a multitude of laser process parameters, such as but not limited to wavelength, beam energy, irradiation duration and number of pulses, can be adjusted to modulate the depth of second vacancy rich regions 875. Moreover, those skilled in the art will appreciate that laser process parameters can vary with the substrate material employed, for example.

Figure 8J:
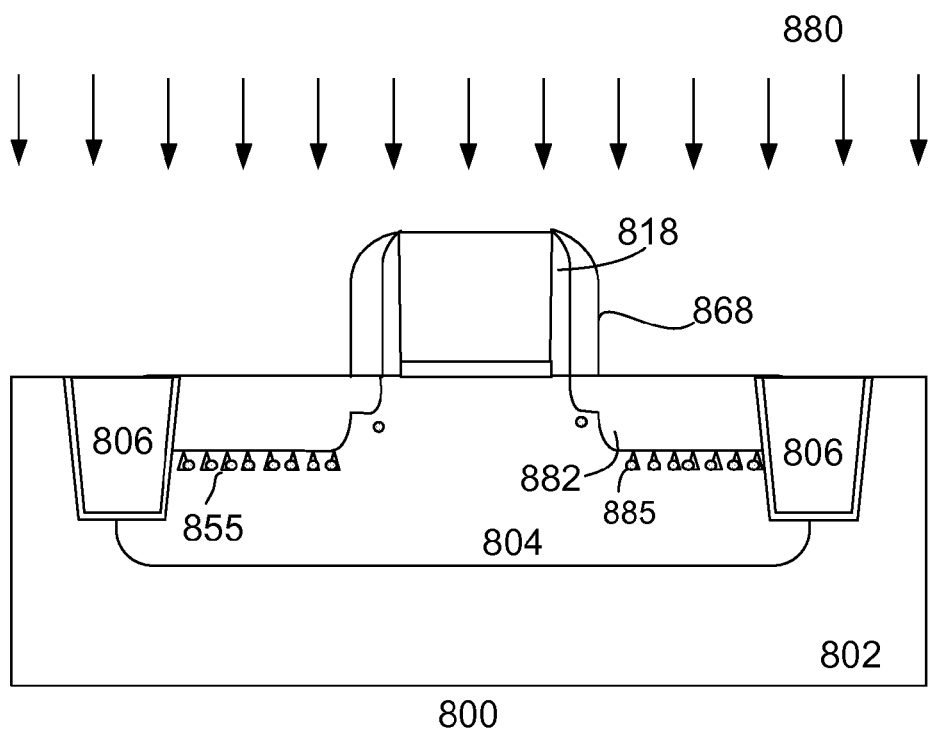

As shown in FIG. 8j, the second offset spacers 868 serve as an implant mask during a deep source/drain implantation step where third dopant species as depicted by arrows 880 are implanted into the substrate. The deep source/drain implantation step forms deep source/drain diffusion regions 882 which are offset from the edge of the gate electrode by the first and second offset spacers (818, 868). The deep source/drain implantation step results in the generation of EOR defect regions 885 which are located approximately at or as illustrated in FIG. 8i slightly below the depth of the deep source/drain regions 882. To achieve the optimum effect from the second pre-implant laser step, the location of an end of range region generated by the deep source/drain implant is substantially matched with the location of the second vacancy rich region. The preceding may be achieved either by tuning the deep source/drain implant conditions or second pre-implant conditions such as melting laser power.

In one embodiment, a PFET device is fabricated and the deep source/drain regions 882 may be formed by implanting heavily doped P-type impurity ions. Non-limiting examples of P-type dopants include Boron, Gallium, Indium or compounds thereof. In another embodiment, an NFET is fabricated and the third dopant species are heavily doped N-type impurity ions. Non-limiting examples of N-type dopants include Phosphorus, Arsenic or compounds thereof.

Figure 8K:
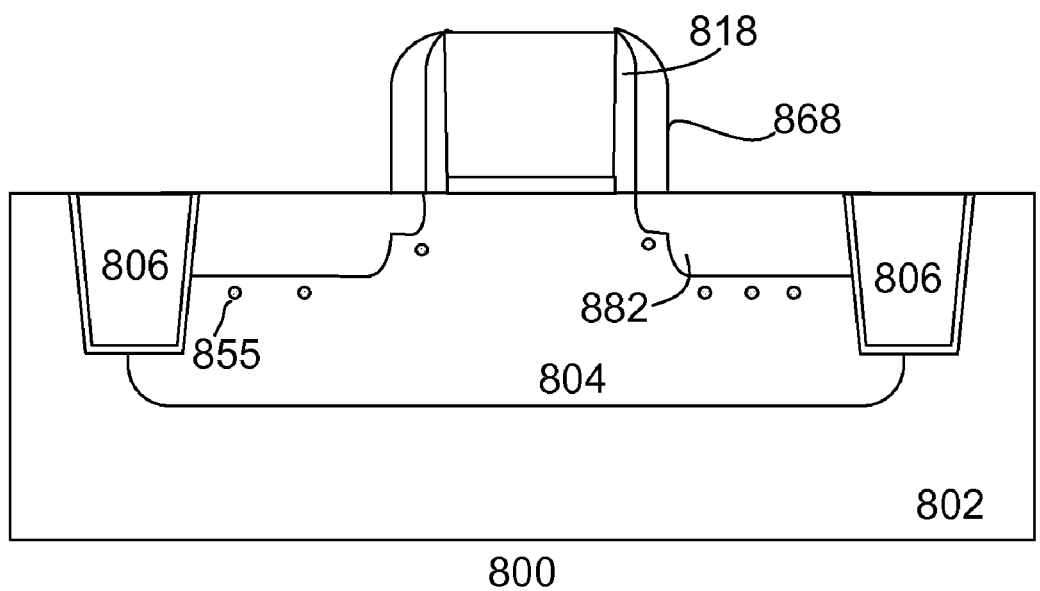

FIG. 8k shows the semiconductor structure 800 of FIG. 8j after the dopants in the source/drain extension and deep source/drain regions are activated by an annealing process. By way of example, the annealing process may be a low temperature thermal anneal, rapid thermal anneal, spike anneal, flash anneal or laser anneal process.

In the third embodiment of the invention illustrated in FIGS. 8a to 8j, pre-implant laser irradiation processes are used to form vacancy rich regions prior to a pre-amorphization implant and a deep source drain implant. The location of the vacancy rich regions and hence laser irradiation conditions adjusted to locate the vacancy rich regions proximate to the EOR regions generated by both implants. In accordance with the invention, multiple pre-implant laser irradiation steps may be applied to create vacancy rich regions that reduce defects in and around an EOR defect region. It is to be appreciated that application of this concept is not limited to the specific process flow described in relation to FIGS. 8a to 8j.

The preferred embodiment of the invention is illustrative of the invention rather than limiting of the invention. It is to be understood that revisions and modifications may be made to methods, materials, structures and dimensions of a semiconductor structure while still providing a semiconductor that fall within the scope of the included claims. All matters hitherto-fore set forth herein or shown in the accompanying drawings are to be interpreted in an illustrative and non-limiting sense.

What is claimed is:

1. A method for fabricating a semiconductor device comprising:
providing a substrate;
forming a gate stack over the substrate;
performing a first laser processing to form vacancy rich regions within the substrate on opposing sides of the gate stack, the vacancy rich regions having a first depth from a surface of the substrate; and
performing a first implant, the first implant causing end of range defect regions to be formed on opposing sides of the gate stack at a second depth from the surface of the substrate,
wherein the first depth is proximate to the second depth.

2. The method of claim 1, wherein the first and second depth are substantially equal.

3. The method of claim 1, wherein the first implant is an amorphization implant that forms amorphous regions within the substrate.

4. A method for fabricating a semiconductor device comprising:
providing a substrate and a gate stack formed on the substrate;
performing a first laser processing to form vacancy rich regions within the substrate on opposing sides of the gate stack, the vacancy rich regions having a peak concentration of excess vacancies at a first depth from a surface of the substrate; and
performing a pre-amorphization implant to create amorphous regions within the substrate adjacent to opposing sides of the gate stack, the pre-amorphization implant causing end of range defect regions with a peak concentration of interstitial defects at a second depth from a surface of the substrate to be generated,
wherein the first depth is proximate to the second depth.

5. The method of claim 4 further comprising:
forming first diffusion regions overlapping the amorphous regions; and
activating dopants in the first diffusion region wherein the excess vacancies in the vacancy rich region reduce diffusion of the dopants in the first diffusion region.

6. The method of claim 1, wherein the first depth is deeper than the second depth.

7. The method of claim 1, wherein the first implant forms diffusion regions on opposed sides of the gate stack.

8. The method of claim 7, wherein the first implant is a source/drain implant that forms source/drain regions in the substrate.

9. The method of claim 8, further comprising activating dopants in the source/drain regions, wherein the excess vacancies in the vacancy rich region reduce diffusion of the dopants in the source/drain regions.

10. The method of claim 1, wherein the gate stack comprises a sacrificial gate electrode, the sacrificial gate electrode being removed after the first laser processing.

11. A method for fabricating a semiconductor device comprising:
providing a substrate;
forming a gate stack over the substrate;
performing a first laser processing to form vacancy rich regions within the substrate on opposing sides of the gate stack, the vacancy rich regions having a first depth from a surface of the substrate; and
performing a first implant, the first implant causing end of range defect regions to be formed on opposing sides of the gate stack at a second depth from the surface of the substrate.

12. The method of claim 11 wherein the second depth is proximate to the first depth.

13. The method of claim 11, wherein the first depth is deeper than the second depth.

14. The method of claim 11, wherein the first implant is an amorphization implant that forms amorphous regions within the substrate.

15. The method of claim 11, wherein the first implant forms diffusion regions on opposed sides of the gate stack.

16. The method of claim 15, wherein the first implant is a source/drain implant that forms source/drain regions in the substrate.

17. The method of claim 16, further comprising activating dopants in the source/drain regions, wherein the excess vacancies in the vacancy rich region reduce diffusion of the dopants in the source/drain regions.

18. A method for fabricating a semiconductor device comprising:
providing a substrate;
forming a gate stack over the substrate, wherein the gate stack comprises a sacrificial gate electrode;
performing a first laser processing to form vacancy rich regions within the substrate on opposing sides of the gate stack, the vacancy rich regions having a first depth from a surface of the substrate, the sacrificial gate electrode being removed after the first laser processing; and
performing a first implant, the first implant causing end of range defect regions to be formed on opposing sides of the gate stack at a second depth from the surface of the substrate.

* * * * *